United States Patent
Hatakeyama et al.

(10) Patent No.: US 8,741,548 B2
(45) Date of Patent: Jun. 3, 2014

(54) PATTERNING PROCESS

(75) Inventors: Jun Hatakeyama, Joetsu (JP); Takao Yoshihara, Joetsu (JP); Katsuya Takemura, Joetsu (JP); Yoshio Kawai, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 746 days.

(21) Appl. No.: 12/194,129

(22) Filed: Aug. 19, 2008

(65) Prior Publication Data
US 2009/0053651 A1 Feb. 26, 2009

(30) Foreign Application Priority Data

Aug. 22, 2007 (JP) ................................. 2007-215860
Nov. 12, 2007 (JP) ................................. 2007-292731

(51) Int. Cl.
*G03F 7/30* (2006.01)
*G03F 7/40* (2006.01)
*G03F 7/38* (2006.01)
*G03F 7/039* (2006.01)

(52) U.S. Cl.
CPC .. *G03F 7/40* (2013.01); *G03F 7/38* (2013.01); *G03F 7/0397* (2013.01)
USPC ............ 430/312; 430/326; 430/330; 430/394

(58) Field of Classification Search
CPC ........... G03F 7/0397; G03F 7/30; G03F 7/38; G03F 7/40
USPC .......................... 430/326, 328, 312, 330, 394
See application file for complete search history.

(56) References Cited

U.S. PATENT DOCUMENTS

| | | | |
|---|---|---|---|
| 5,288,660 A * | 2/1994 | Hua et al. ...................... | 438/571 |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,319,655 B1 | 11/2001 | Wong et al. | |
| 6,448,420 B1 | 9/2002 | Kinsho et al. | |

(Continued)

FOREIGN PATENT DOCUMENTS

| | | |
|---|---|---|
| JP | 05-102029 A | 4/1993 |
| JP | 05-190444 A | 7/1993 |

(Continued)

OTHER PUBLICATIONS

B. J. Lin; "Semiconductor Foundry, Lithography, and Partners"; Micropatterning Division, TSMC, Inc.; Proc. SPIE, vol. 4690 xxix, 2002.

(Continued)

*Primary Examiner* — John Chu
(74) *Attorney, Agent, or Firm* — Westerman, Hattori, Daniels & Adrian, LLP

(57) ABSTRACT

A pattern is formed by applying a first positive resist composition onto a substrate, heat treatment, exposure, heat treatment and development to form a first resist pattern; causing the first resist pattern to crosslink and cure by irradiation of high-energy radiation of up to 180 nm wavelength or EB; further applying a second positive resist composition onto the substrate, heat treatment, exposure, heat treatment and development to form a second resist pattern. The double patterning process reduces the pitch between patterns to one half.

9 Claims, 6 Drawing Sheets

APPLY PHOTORESIST

EXPOSE AND DEVELOP PHOTORESIST

(56) References Cited

U.S. PATENT DOCUMENTS

| | | | |
|---|---|---|---|
| 6,512,020 B1 | 1/2003 | Asakura et al. | |
| 6,593,063 B1* | 7/2003 | Tanaka et al. | 430/311 |
| 6,605,814 B1 | 8/2003 | Tadika et al. | |
| 6,635,404 B1* | 10/2003 | Choi et al. | 430/311 |
| 6,916,591 B2 | 7/2005 | Ohsawa et al. | |
| 7,255,973 B2 | 8/2007 | Hatakeyama et al. | |
| 7,741,015 B2* | 6/2010 | Hatakeyama et al. | 430/312 |
| 7,838,198 B2* | 11/2010 | Chen et al. | 430/270.1 |
| 2003/0096196 A1 | 5/2003 | Mimura et al. | |
| 2005/0208424 A1 | 9/2005 | Hasegawa et al. | |
| 2006/0154185 A1* | 7/2006 | Ho et al. | 430/330 |
| 2006/0228895 A1 | 10/2006 | Chae et al. | |
| 2006/0246377 A1 | 11/2006 | Yamato et al. | |
| 2007/0099129 A1 | 5/2007 | Kitano et al. | |
| 2008/0150091 A1* | 6/2008 | Lin | 257/635 |
| 2012/0161296 A1* | 6/2012 | Lin | 257/635 |

FOREIGN PATENT DOCUMENTS

| | | |
|---|---|---|
| JP | 09-063921 A | 3/1997 |
| JP | 09-095479 A | 4/1997 |
| JP | 09-208554 A | 8/1997 |
| JP | 09-230588 A | 9/1997 |
| JP | 09-301948 A | 11/1997 |
| JP | 2906999 B2 | 4/1999 |
| JP | 2000-314956 A | 11/2000 |
| JP | 2000-327633 A | 11/2000 |
| JP | 2000-331910 A | 11/2000 |
| JP | 2003-502698 A | 1/2003 |
| JP | 2003-158057 A | 5/2003 |
| JP | 2005-189842 A | 7/2005 |
| JP | 2005-197349 A | 7/2005 |
| JP | 2005-264103 A | 9/2005 |
| WO | 2004-074242 A2 | 9/2004 |

OTHER PUBLICATIONS

Soichi Owa et al.; "Immersion lithography; its potential performance and issues", Optical Microlithography XVI; Proc. SPIE, vol. 5040, p. 724, 2003.

Stephen Hsu et al.; "Double Exposure Technique for 45nm node and Beyond"; 25th Annual BACUS Symposium on Photomask Technology; Proc. SPIE, vol. 5992, p. 59921Q-1-16, 2005.

Koji Arimitsu et al.; "Sensitivity Enhancement of Chemical-Amplification-Type Photoimaging Materials by Acetoacetic Acid Derivatives"; Journal of Photopolymer Science and Technology; vol. 8, No. 1, pp. 43-44, 1995.

Kazuaki Kudo et al.; "Enhancement of the Sensitivity of Chemical Amplification-Type Photoimaging Materials by B-Tosyloxyketone Acetals"; Journal of Photopolymer Science and Technology; vol. 8, No. 1, pp. 45-46, 1995.

Koji Arimitsu et al.; "Effect of Phenolic Hydroxyl Residues on the Improvement of Acid-Proliferation-Type Photoimaging Materials"; Journal of Photopolymer Science and Technology; vol. 9, No. 1, pp. 29-30, 1996.

Japanese Office Action dated Nov. 22, 2011, issued in corresponding Japanese Patent Application No. 2008-202940.

Taiwanese Office Action dated Sep. 7, 2012, issued in corresponding Taiwanese Patent Application No. 097131944 (5 pages).

* cited by examiner

APPLY PHOTORESIST

EXPOSE AND DEVELOP PHOTORESIST

ETCH HARD MASK 1

APPLY, EXPOSE AND DEVELOP 2ND PHOTORESIST

ETCH HARD MASK 2

ETCH PROCESSABLE SUBSTRATE

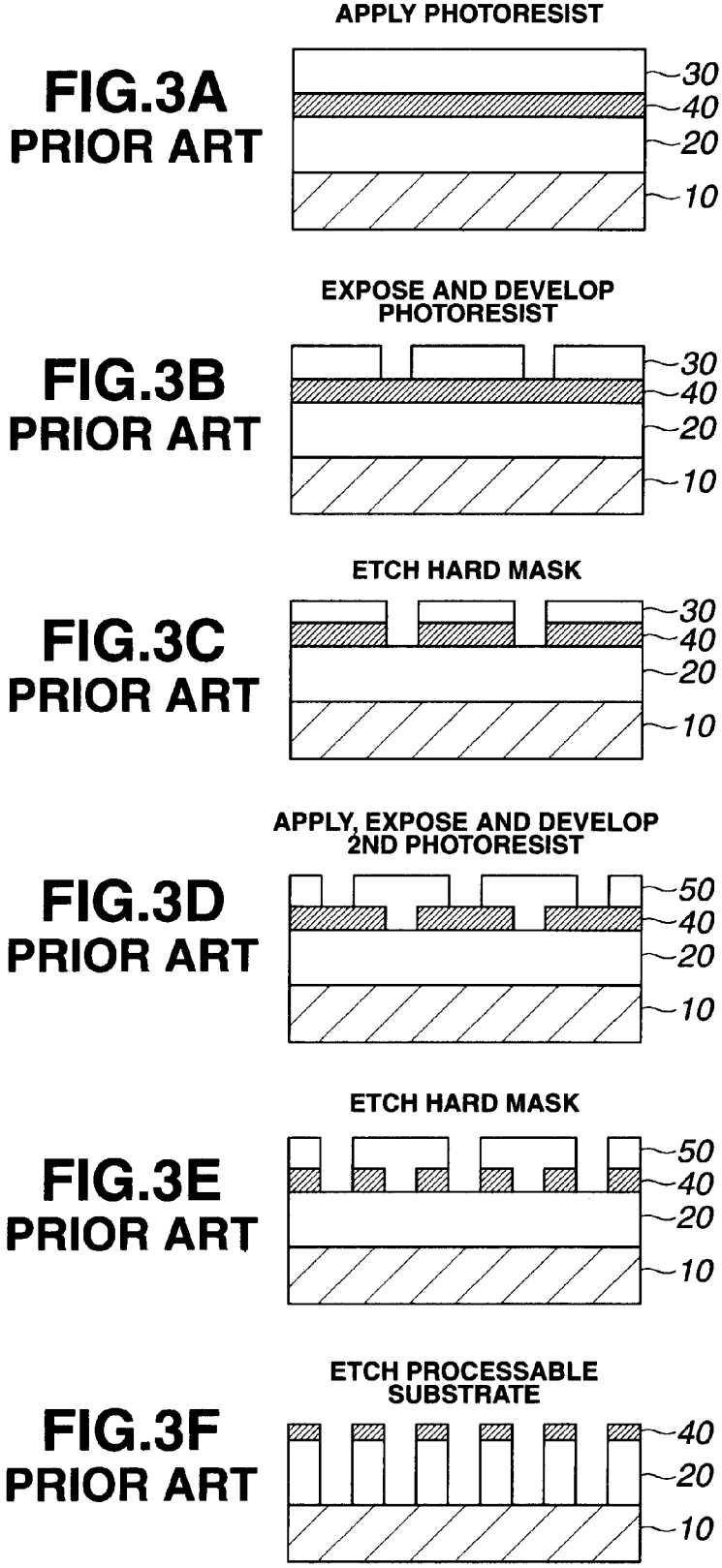

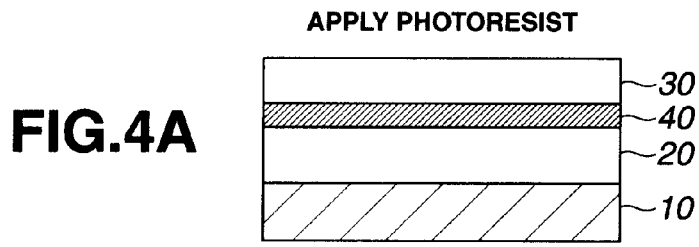
FIG.4A  APPLY PHOTORESIST
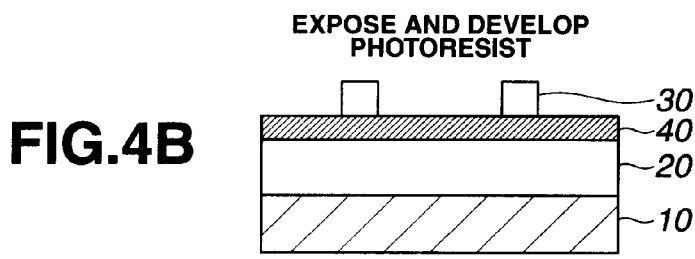
FIG.4B  EXPOSE AND DEVELOP PHOTORESIST
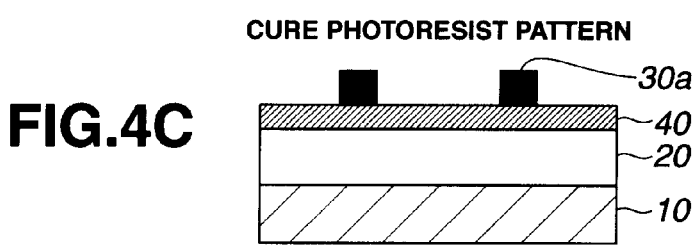
FIG.4C  CURE PHOTORESIST PATTERN
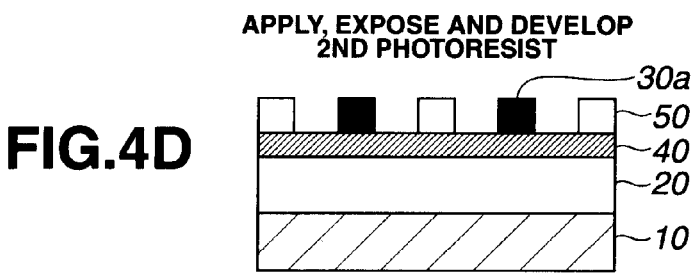
FIG.4D  APPLY, EXPOSE AND DEVELOP 2ND PHOTORESIST
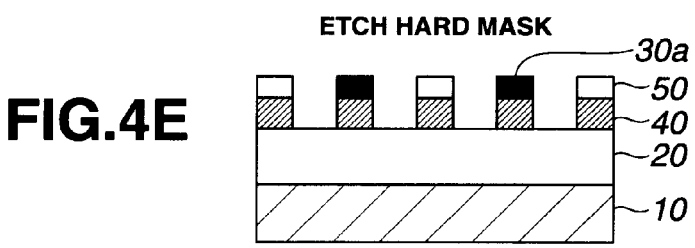
FIG.4E  ETCH HARD MASK
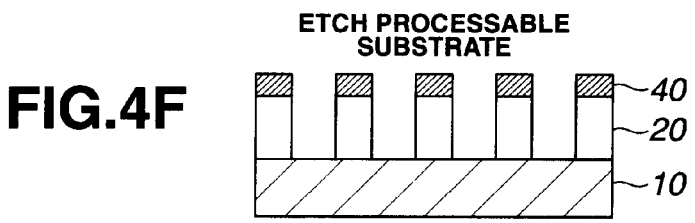
FIG.4F  ETCH PROCESSABLE SUBSTRATE

FIRST PATTERN

SECOND PATTERN

PATTERNING PROCESS

CROSS-REFERENCE TO RELATED APPLICATION

This non-provisional application claims priority under 35 U.S.C. §119(a) on Patent Application Nos. 2007-215860 and 2007-292731 filed in Japan on Aug. 22, 2007 and Nov. 12, 2007, respectively, the entire contents of which are hereby incorporated by reference.

TECHNICAL FIELD

This invention relates to a process for forming a pattern by forming a first pattern through first exposure, rendering the first pattern insoluble in organic solvent or alkaline water by irradiation of ultra-short wavelength radiation or electron beam (EB), and forming a line pattern in spaces of the first pattern through second exposure, for thereby reducing the distance between the patterns.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $\frac{1}{100}°$ C. while it was recognized that the impact of heat from the resist film upon light exposure drew little concern. There was a likelihood that micro-bubbles in water could be transferred to the pattern. The risk of bubble generation could be obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern portions. See Proc. SPIE, Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. Since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to a reduced throughput.

Both the former and latter processes require two etchings for substrate processing, leaving the issues of a reduced throughput and deformation and misregistration of the pattern by two etchings.

To proceed with a single etching, one method is by using a negative resist material in a first exposure and a positive resist material in a second exposure. Another method is by using a positive resist material in a first exposure and a negative resist material in a higher alcohol of 3 or more carbon atoms, in which the positive resist material is not dissolvable, in a second exposure. In these methods using negative resist materials with low resolution, degradation of resolution occurs.

A method which does not involve post-exposure bake (PEB) and development between first and second exposures is the simplest method. This method involves first exposure, replacement by a mask having a shifted pattern drawn, second exposure, PEB, development and dry etching. Since the throughput is substantially reduced by mask replacement on every exposure, the first exposure is carried out in a somewhat integrated manner before the second exposure is carried out. Then, depending on the holding time between the first exposure and the second exposure, a dimensional variation due to acid diffusion and a profile variation such as T-top profile formation occur. To suppress the T-top formation, application of a resist protective film is effective. Application of a resist protective film for immersion lithography enables a process involving two exposures, one PEB, development and dry etching. First exposure and second exposure may be consecutively carried out by two scanners arranged side by side. This gives rise to such problems as misregistration due to lens aberration between the two scanners and the doubled scanner cost.

If a common resist surface is subjected to exposure under the condition that the first exposure and the second exposure are shifted half-pitch, no pattern is generally formed because the first exposure light offsets the second exposure light. If a contrast enhancement layer (CEL) is applied, the light incident on the resist film becomes nonlinear so that the contrast is increased, and no offset occurs between half-pitch shifted exposures. Then the resist protective film for the double patterning desirably has a function of CEL. Also, if a nonlinear acid generator capable of two-photon absorption is used, it is theoretically possible to carry out double patterning exposures using solely the resist film without CEL. However, an acid generator capable of two-photon absorption has not been reported in conjunction with exposure at wavelength 200 nm or below.

The most critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

While the technique of modifying a photoresist film by light irradiation is well known in the art, studies have been made thereon for improving etch resistance. In JP-A 5-102029, for example, light of short wavelength is irradiated to a photoresist film on a substrate in vacuum while heating the substrate on a hot plate. JP-A 5-190444, JP-A 9-63921, JP-A 2000-331910, and JP-A 2003-158057 disclose suitable light irradiating systems. JP-A 2005-189842 describes means for preventing a resist pattern from collapsing by supplying a solution containing a photo-crosslinkable agent onto a photoresist film as developed, and irradiating light of short wavelength to the photoresist film to render it hydrophobic.

DISCLOSURE OF THE INVENTION

As discussed above, when substrate processing is carried out by double dry etchings using a resist pattern fabricated by double exposures and developments, the throughput is reduced to one half. Also an issue of pattern misregistration by dry etchings occurs.

An object of the invention is to provide a pattern forming process which involves curing of a resist coating by irradiation of light with an extremely short wavelength of up to 180 nm, for preventing intermixing between first and second resist films and dissolution of the first resist pattern in a developer in the second development, in order to enable a double patterning process of processing a substrate by a single dry etching.

It has been found that a double patterning process comprising a first set of coating, exposure and development steps to form a first resist pattern, and a second set of coating, exposure and development steps to form a second resist pattern in spaces of the first resist pattern is improved by the following measure.

The above and other objects can be achieved by a pattern forming process as defined below.

A first embodiment of the invention provides a process for forming a pattern, comprising the steps of:

applying a first positive resist composition comprising a polymer onto a substrate to form a first resist coating, heat treating the first resist coating, exposing to high-energy radiation, heat treating the exposed coating, developing the coating with a developer to form a first resist pattern, causing the first resist pattern to crosslink and cure by irradiation of high-energy radiation of up to 180 nm wavelength or electron beam, applying a second positive resist composition comprising a polymer onto the first resist pattern-bearing substrate to form a second resist coating, heat treating the second resist coating, exposing to high-energy radiation, heat treating the exposed coating, developing the second coating with a developer to form a second resist pattern.

A second embodiment of the invention provides a process for forming a pattern, comprising the steps of:

applying a first positive resist composition comprising a polymer onto a substrate to form a first resist coating, heat treating the first resist coating, exposing to high-energy radiation, heat treating the exposed coating, developing the coating with a developer to form a first resist pattern, causing the first resist pattern to crosslink and cure by irradiation of high-energy radiation of up to 180 nm wavelength or electron beam and heating, applying a second positive resist composition comprising a polymer onto the first resist pattern-bearing substrate to form a second resist coating, heat treating the second resist coating, exposing to high-energy radiation, heat treating the exposed coating, developing the second coating with a developer to form a second resist pattern.

In a preferred embodiment, the step of causing the first resist pattern to crosslink and cure by irradiation of high-energy radiation of up to 180 nm wavelength includes irradiation of $Xe_2$ excimer light of 172 nm wavelength, $F_2$ excimer light of 157 nm wavelength, $Kr_2$ excimer light of 146 nm wavelength, $Ar_2$ excimer light of 126 nm wavelength, or electron beam.

In another preferred embodiment, the exposure steps to form the first and second resist patterns are by immersion lithography using an ArF excimer laser of 193 nm wavelength and a liquid having a refractive index of at least 1.4 interposed between a lens and the substrate. A typical liquid is water.

In further preferred embodiments, the first resist pattern includes spaces, the second resist pattern is formed in the spaces of the first resist pattern, whereby the distance between the first and second patterns is reduced; the first resist pattern crosses the second resist pattern; or the second resist pattern is formed in a space area where the first resist pattern is not formed.

A still further preferred embodiment uses the first positive resist composition comprising a polymer, an organic solvent, and an acid generator. The polymer comprises one or both of recurring units (a-1) and (a-2) of the general formula (1), and recurring units of the general formula (b).

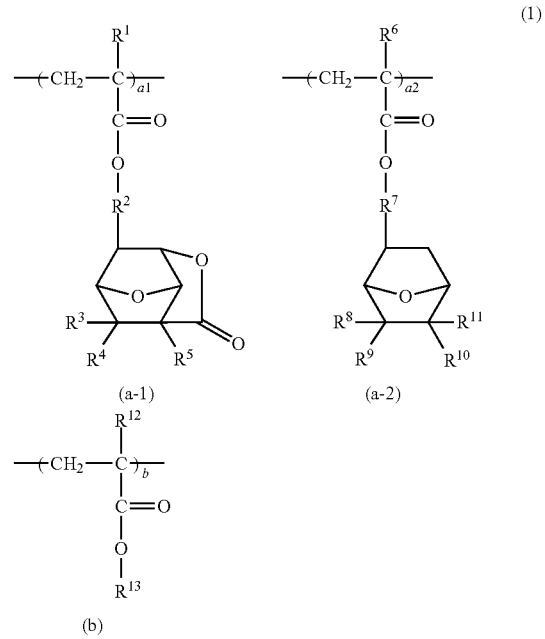

Herein $R^1$ and $R^6$ are each independently hydrogen, methyl or hydroxymethyl; $R^2$ and $R^7$ are each independently a single bond or a straight, branched or cyclic alkylene group of 1 to 6 carbon atoms which may have an ether or ester group, and which has a primary or secondary carbon atom through which it is attached to the ester (COO) group; $R^3, R^4, R^5, R^8, R^9, R^{10}$, and $R^{11}$ are each independently hydrogen or a straight, branched or cyclic alkyl group of 1 to 6 carbon atoms; $R^{12}$ is hydrogen, methyl or hydroxymethyl; $R^{13}$ is an acid labile group; a1, a2, and b are numbers in the range: $0 \leq a1 < 1.0$, $0 \leq a2 < 1.0$, $0 < a1+a2 < 1.0$, $0 < b \leq 0.8$, and $0.1 \leq a1+a2+b \leq 1.0$.

BENEFITS OF THE INVENTION

According to the invention, a first resist pattern is formed through exposure and development. Through crosslinking reaction induced by high-energy radiation with a short wavelength of up to 180 nm, specifically $Xe_2$ excimer light of 172 nm, $F_2$ excimer light of 157 nm, $Kr_2$ excimer light of 146 nm, $Ar_2$ excimer light of 126 nm wavelength or electron beam, the first pattern is then insolubilized in alkaline developer and resist solution. A resist solution is further applied onto the first resist pattern and substrate, exposed and developed to form a second resist pattern in the space area of the first resist pattern. This double patterning process reduces the pitch between patterns to one half. The substrate can be processed by a single dry etching.

BRIEF DESCRIPTION OF THE DRAWINGS

FIG. 1-A shows a laminate of substrate, processable substrate, hard mask and resist film, FIG. 1-B shows the resist film being exposed and developed, FIG. 1-C shows the hard mask being etched, FIG. 1-D shows a second resist film being formed, exposed and developed, and FIG. 1-E shows the processable substrate being etched.

FIG. 2-A shows a laminate of substrate, processable substrate, 1st and 2nd hard masks and resist film, FIG. 2-B shows the resist film being exposed and developed, FIG. 2-C shows the 2nd hard mask being etched, FIG. 2-D shows, after removal of the first resist film, a second resist film being formed, exposed and developed, FIG. 2-E shows the 1st hard mask being etched, and FIG. 2-F shows the processable substrate being etched.

FIG. 3 is a cross-sectional view of a further exemplary prior art double patterning process. FIG. 3-A shows a laminate of substrate, processable substrate, hard mask and resist film, FIG. 3-B shows the resist film being exposed and developed, FIG. 3-C shows the hard mask being etched, FIG. 3-D shows, after removal of the first resist film, a second resist film being formed, exposed and developed, FIG. 3-E shows the hard mask being etched, and FIG. 3-F shows the processable substrate being etched.

FIG. 4 is a cross-sectional view of a double patterning process according one embodiment of the invention. FIG. 4-A shows a laminate of substrate, processable substrate, hard mask and resist film, FIG. 4-B shows the resist film being exposed and developed, FIG. 4-C shows the resist film being crosslinked, FIG. 4-D shows a second resist film being formed, exposed and developed, FIG. 4-E shows the hard mask being etched, and FIG. 4-F shows the processable substrate being etched.

DESCRIPTION OF THE PREFERRED EMBODIMENT

Figure 1A:
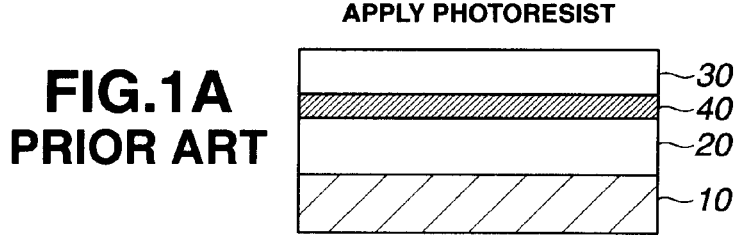
FIG. 1 is a cross-sectional view of an exemplary prior art double patterning process.
Figure 1B:
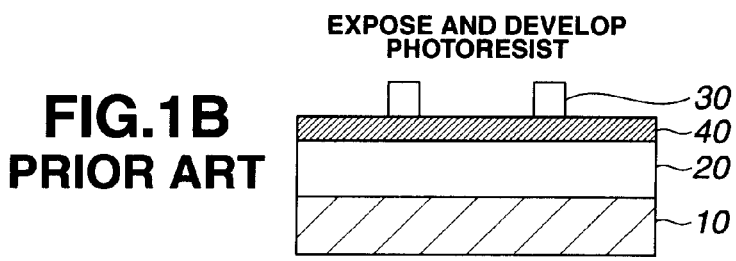
Figure 1C:
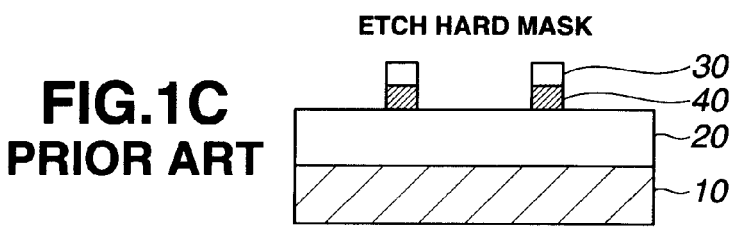
Figure 1D:
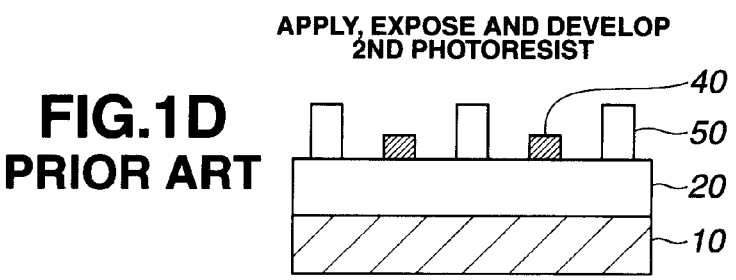
Figure 1E:
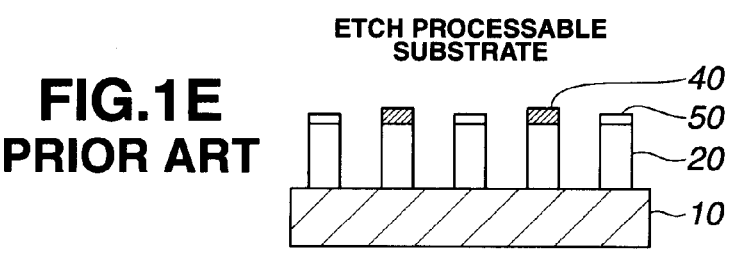
Figure 2A:
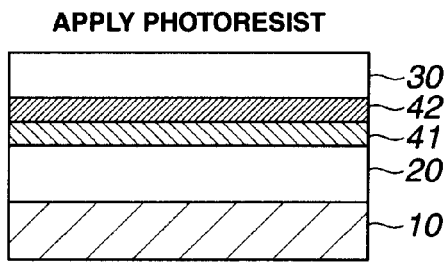
FIG. 2 is a cross-sectional view of another exemplary prior art double patterning process.
Figure 2B:
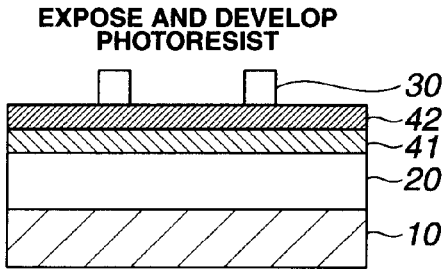
Figure 2C:
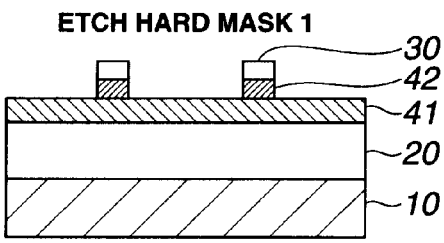
Figure 2D:
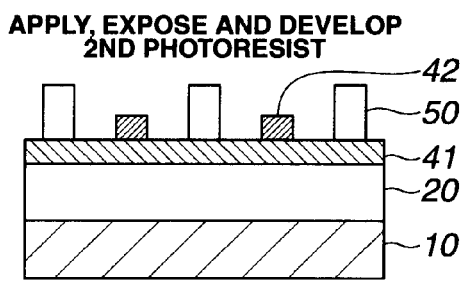
Figure 2E:
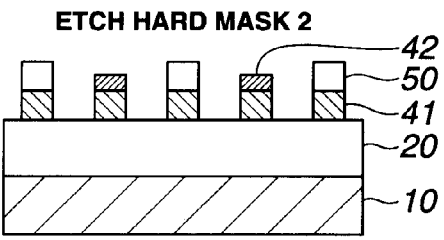
Figure 2F:
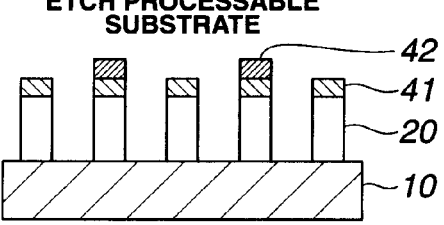

The singular forms "a", "an" and "the" include plural referents unless the context clearly dictates otherwise.

As used herein, the terminology "($C_x$-$C_y$)", as applied to a particular unit, such as, for example, a chemical compound or a chemical substituent group, means having a carbon atom content of from "x" carbon atoms to "y" carbon atoms per such unit.

In connection with the double patterning lithography involving double exposures and developments to form a half-pitch pattern, the inventors made efforts to develop a positive resist material which enables to process a substrate by a single dry etching.

The inventors have discovered that a double patterning process capable of reducing the pitch between patterns to one half can be practiced by effecting exposure and development to form a first resist pattern of the positive resist composition on a substrate. In the first resist pattern, crosslinking reaction is then induced by irradiation of high-energy radiation with a wavelength of up to 180 nm, specifically $Xe_2$ excimer light of 172 nm, $F_2$ excimer light of 157 nm, $Kr_2$ excimer light of 146 nm, $Ar_2$ excimer light of 126 nm wavelength or electron beam, for thereby rendering the first resist pattern insoluble in alkaline developer and resist solvent. A resist solution is further applied onto the first resist pattern-bearing substrate, followed by exposure and development to form a second resist pattern in the space area of the first resist pattern. Then the substrate can be processed by a single dry etching. The present invention is predicated on this discovery.

In a preferred embodiment, the resist compositions of which the first resist pattern and optionally second resist pattern are formed are chemically amplified positive resist compositions, specifically comprising a base resin comprising at least recurring units having acid labile groups and recurring units having adhesive groups of hydroxy and/or lactone ring.

These chemically amplified positive resist compositions are firmly adherent to substrates due to inclusion of recurring units having adhesive groups of hydroxy and/or lactone ring in the base resin. In addition, inclusion of recurring units having acid labile groups in the base resin allows the compositions to form patterns at a very high accuracy through the mechanism that the acid labile groups are deprotected by the acid generated from the acid generator upon light exposure so that the exposed areas of the resist are converted to be soluble in a developer.

In the patterning process of the invention, a chemically amplified positive resist composition is used in forming the first resist pattern. The composition comprises a polymer as the base resin, specifically a polymer comprising recurring units having hydroxy groups or lactone rings as adhesive groups, more specifically 7-oxanorbornane ring-bearing recurring units and even more specifically, recurring units having the general formula (a-1) and/or (a-2) shown below.

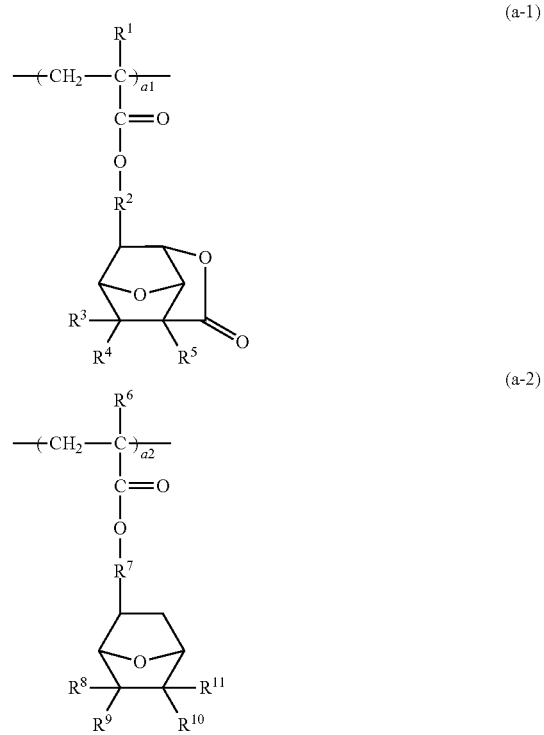

Herein $R^1$ and $R^6$, which may be the same or different, are hydrogen, methyl or hydroxymethyl; $R^2$ and $R^7$ are each independently a single bond or a straight, branched or cyclic alkylene group of 1 to 6 carbon atoms, which may have an ether (—O—) or ester (—COO—) group, with the proviso that when $R^2$ and $R^7$ each are a straight, branched or cyclic alkylene group of 1 to 6 carbon atoms, it has a carbon atom attached to the ester moiety in the formula which is primary or secondary; $R^3$, $R^4$, $R^5$, $R^8$, $R^9$, $R^{10}$, and $R^{11}$ are each independently hydrogen or a straight, branched or cyclic alkyl group of 1 to 6 carbon atoms; a1 and a2 are numbers in the range: $0 \leq a1 < 1.0$, $0 \leq a2 < 1.0$, and $0 < a1+a2 < 1.0$.

Exemplary $C_1$-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Exemplary $C_1$-$C_6$ alkyl groups include methyl, ethyl, n-propyl, isopropyl, n-butyl, isobutyl, sec-butyl, n-pentyl, isopentyl, cyclopentyl, n-hexyl, and cyclohexyl.

Monomers from which recurring units of formulae (a-1) and (a-2) are derived include those having the following general formulae Ma1 and Ma2 wherein $R^1$ to $R^{11}$ are as defined above.

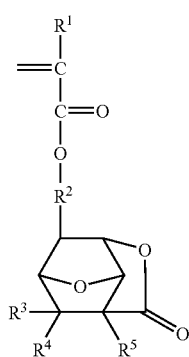

Ma1

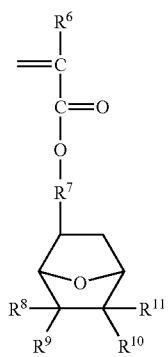

Ma2

Examples of suitable monomers are illustrated below.

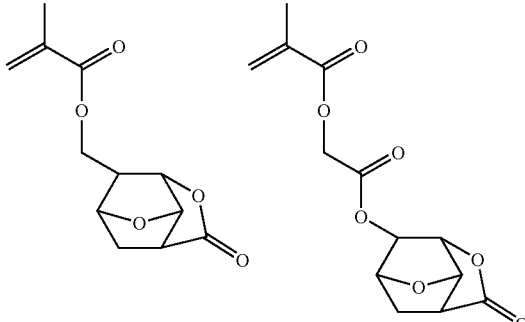

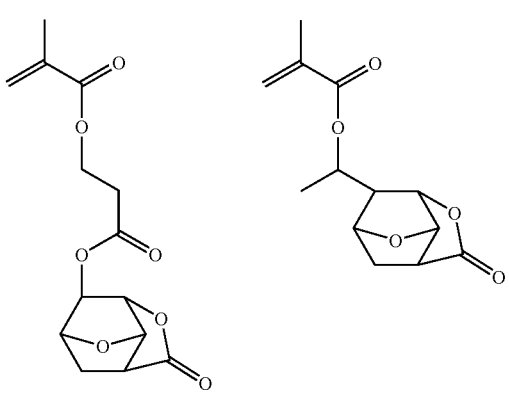

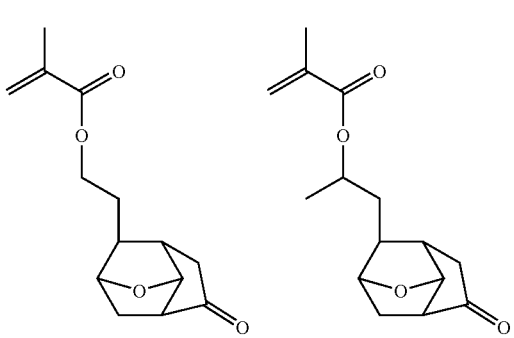

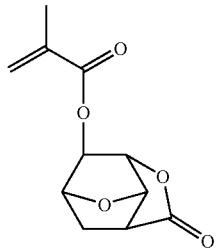 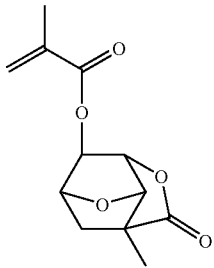

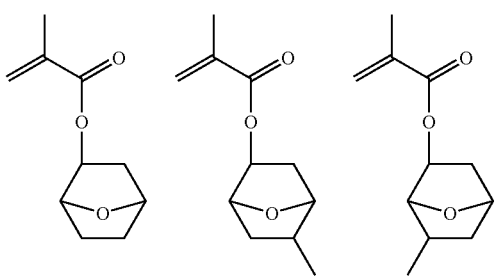

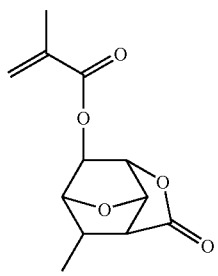 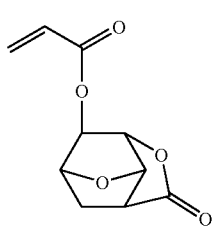

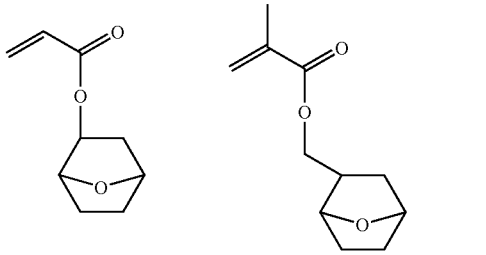

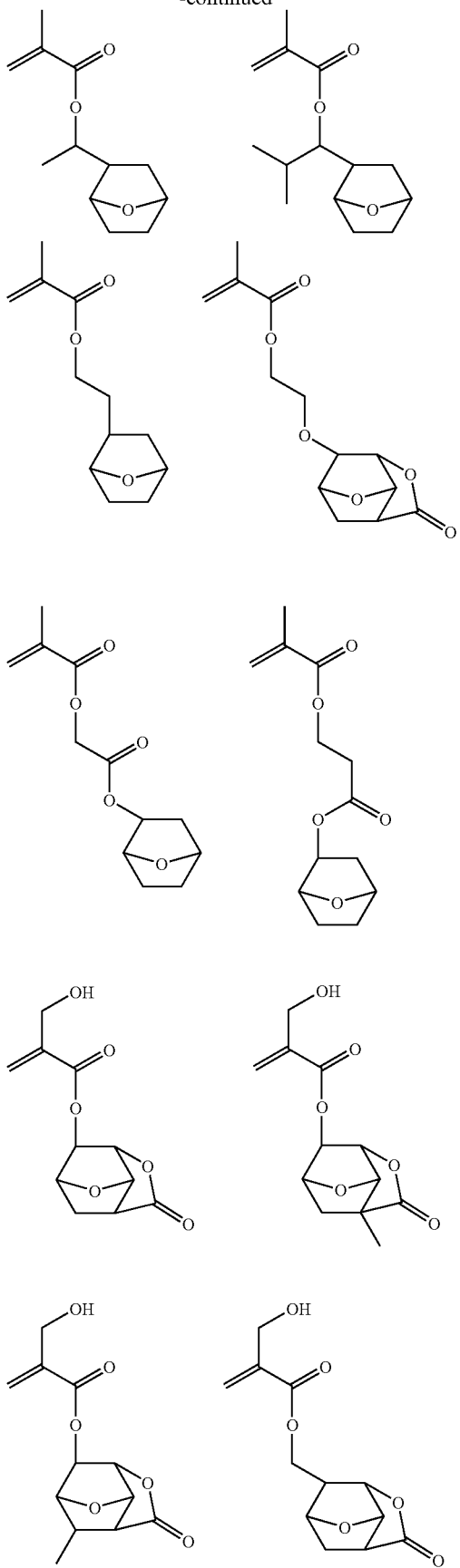

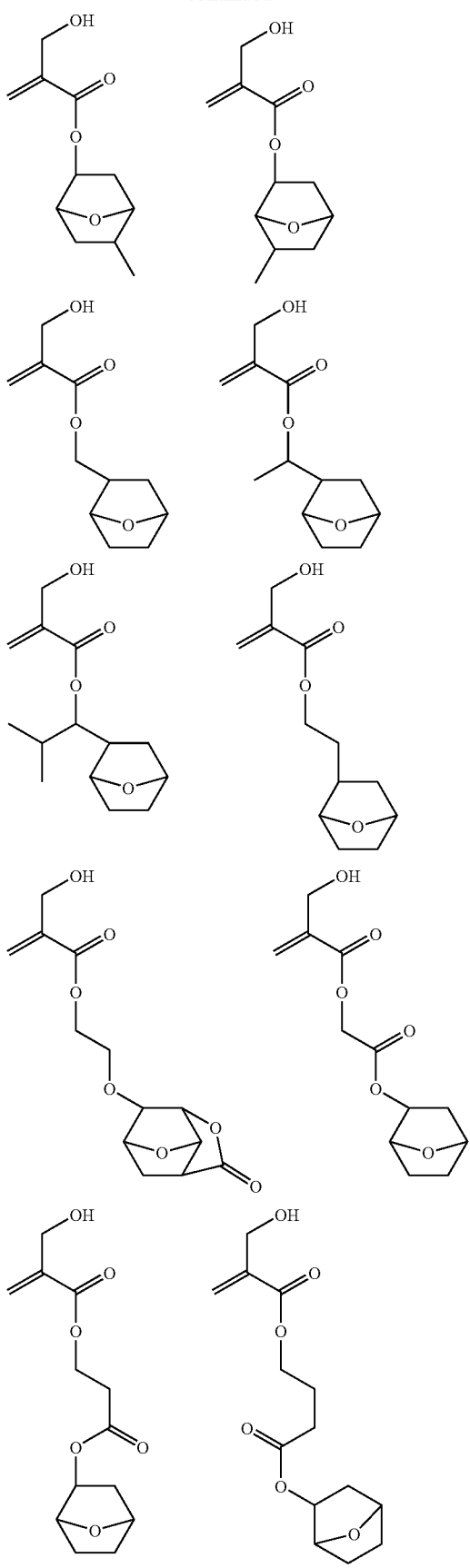
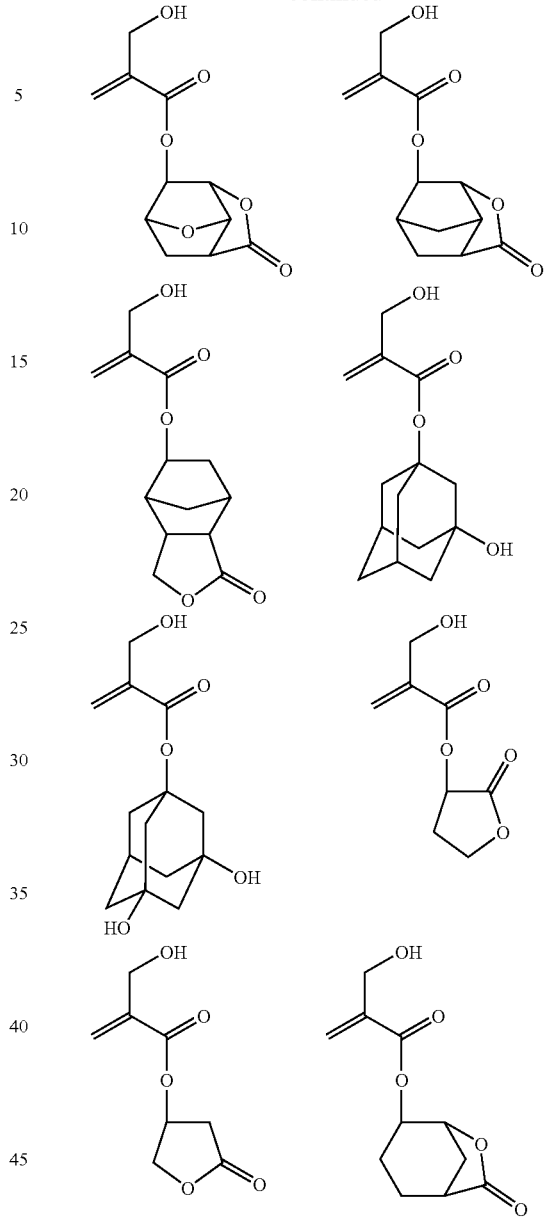

Upon polymerization, the hydroxy moiety of α-hydroxymethyl group is substituted by an acetoxy group or the like, which can be converted back to a hydroxy moiety by alkaline hydrolysis after polymerization. The α-hydroxymethyl groups serve to promote intermolecular and intramolecular crosslinking, and thus after formation of a first pattern, to increase the efficiency of pattern curing.

In order that after the first pattern is formed through exposure and development, a second positive resist composition be coated thereon and processed to form a second pattern in the space area of the first pattern, the first pattern after its formation must be insoluble in photoresist solution and alkaline developer. To this end, the first pattern after its formation must be insolubilized by crosslinking so that it is insoluble in a solvent and alkaline developer for the second positive resist composition.

When a polymer comprising recurring units having oxirane or oxetane is used as a base polymer for resist, crosslinking takes place at the temperature of resist process such as post-exposure bake (PEB) at about 90 to 130° C. because the oxirane or oxetane ring has a very high rate of acid-induced cleavage reaction. Then the polymer becomes alkali insoluble, failing to function as the positive resist material. In contrast, the 1,4-epoxy bond on the 7-oxanorbornane ring has a lower rate of acid-induced cleavage reaction than the oxirane and oxetane rings so that crosslinking does not take place in the temperature range of PEB. Then the 7-oxanorbornane ring-bearing recurring units are stable against acid during the process until development, and exert a function of enhancing adhesion and alkali solubility as a hydrophilic group. However, it is believed that under the action of the acid generated by pattern flood exposure or heating after development and heating at or above 180° C., the 1,4-epoxy bond on the 7-oxanorbornane ring undergoes ring-opening, allowing crosslinking reaction to take place, whereby the polymer becomes insoluble in alkaline developer and resist solvent. Under the action of the acid generated by pattern flood exposure or heating after development and heating at or above 180° C. as described above, the acid labile groups are deprotected. Owing to their alicyclic structure, the acid labile groups are effective in improving dry etch resistance. Although deprotection of acid labile groups leads to a lowering of dry etch resistance, crosslinking reaction due to ring-opening of 7-oxanorbornane ring achieves an improvement in dry etch resistance. These lead to an eventual improvement in etch resistance.

Accordingly, the invention encompasses a double patterning process capable of forming a half-pitch fine-feature-size pattern through double exposures and a single dry etching, by using as the resist base polymer a polymer comprising recurring units of a specific oxanorbornane ring structure-bearing compound which do not crosslink at the temperature of the resist process, for example, at pre-baking and PEB temperatures of about 90 to 130° C., but crosslink with the aid of the acid generated by exposure and heat after development and high-temperature baking. The positive resist composition for use in the process is also contemplated.

Light irradiation and optional heating after the first patterning accelerate not only crosslinking reaction due to ring-opening of 7-oxanorbornane rings, but also other crosslinking reactions, thereby forming a robust pattern which will not be deformed by coating and development of a second resist composition.

The base polymer in the positive resist composition for use in the pattern forming process of the invention is in a preferred embodiment a polymer comprising crosslinkable recurring units having the general formula (a-1) and/or (a-2) shown above and acid labile group-bearing recurring units having the general formula (b) shown below.

(b)

Herein $R^{12}$ is hydrogen, methyl or hydroxymethyl, $R^{13}$ is an acid labile group, and b is a number in the range: $0<b\leq0.8$.

Monomers from which recurring units of formula (b) are derived include those having the following general formula Mb wherein $R^{12}$ and $R^{13}$ are as defined above.

Mb

The acid labile groups represented by $R^{13}$ in formula (b) may be selected from a variety of such groups. Preferred acid labile groups are groups of formulae (AL-10) and (AL-11), tertiary alkyl groups of 4 to 40 carbon atoms represented by formula (AL-12), and oxoalkyl groups of 4 to 20 carbon atoms, but not limited thereto.

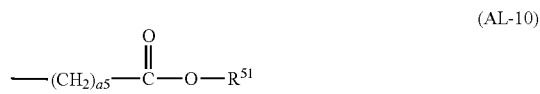

(AL-10)

(AL-11)

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

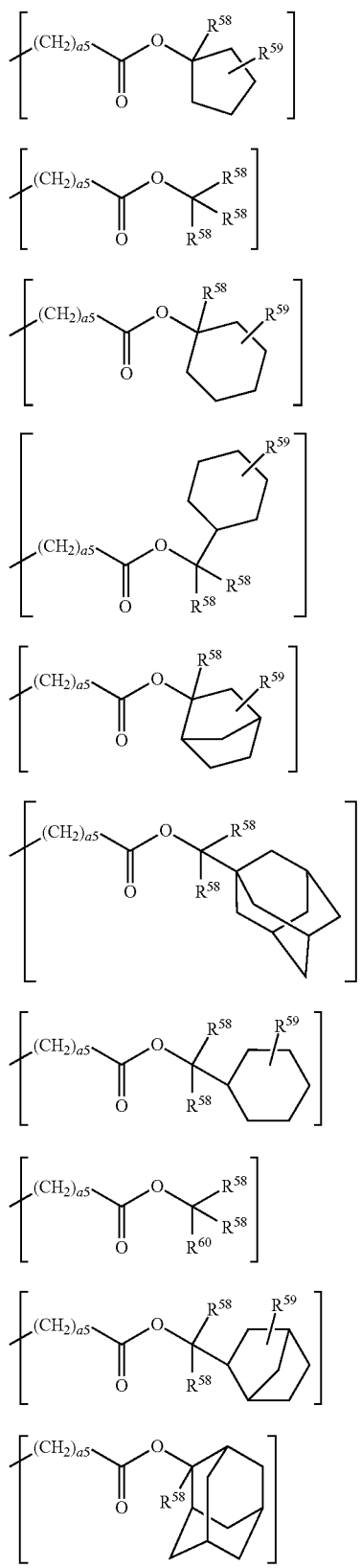

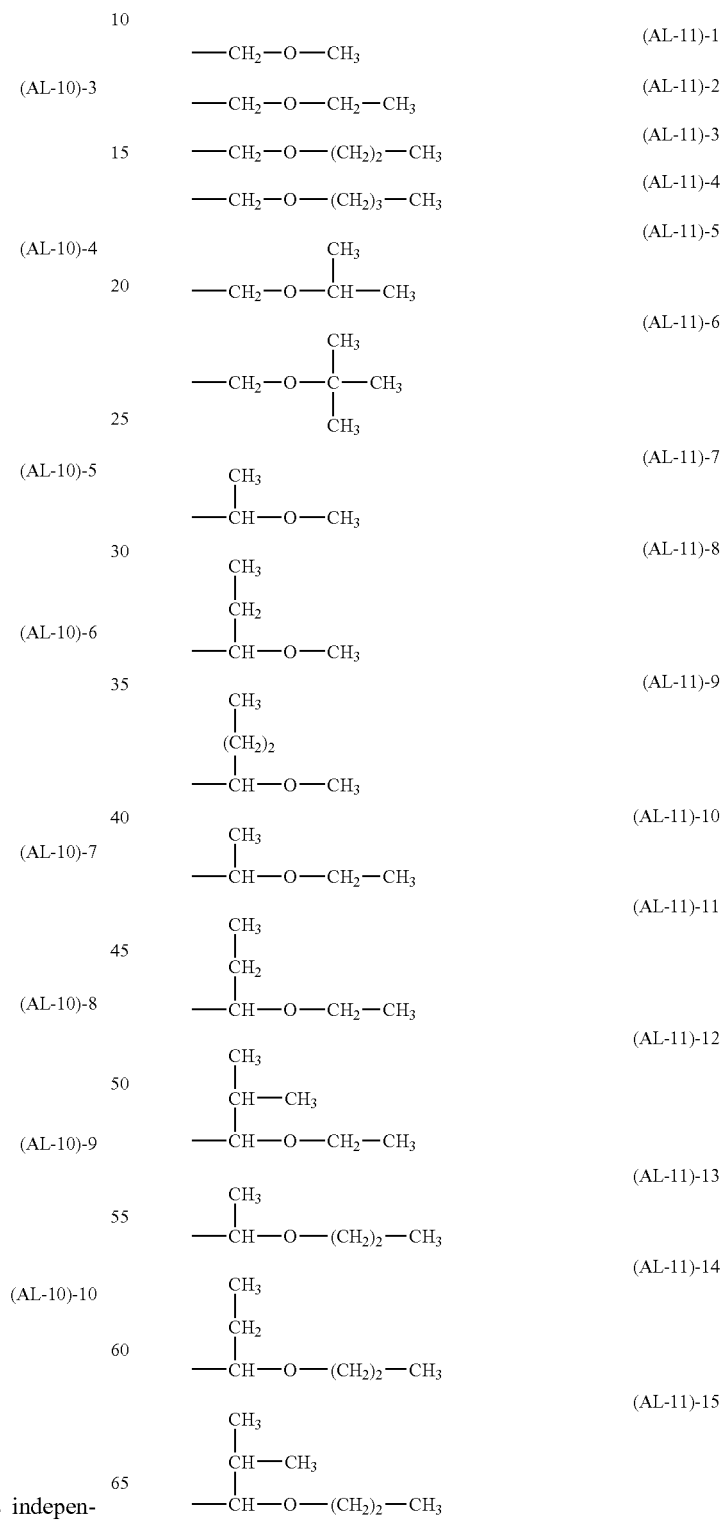

$C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-34.

In formulae (AL-10)-1 to (AL-10)-10, $R^{58}$ is independently a straight, branched or cyclic $C_1$-$C_8$ alkyl group,

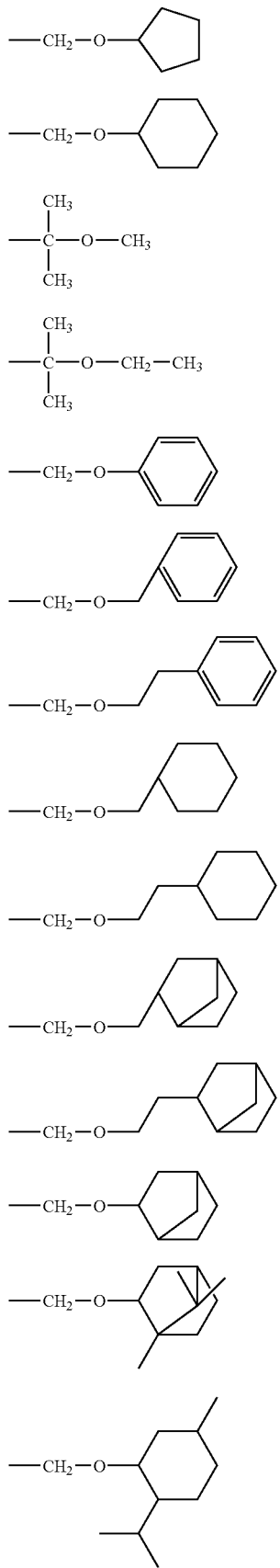

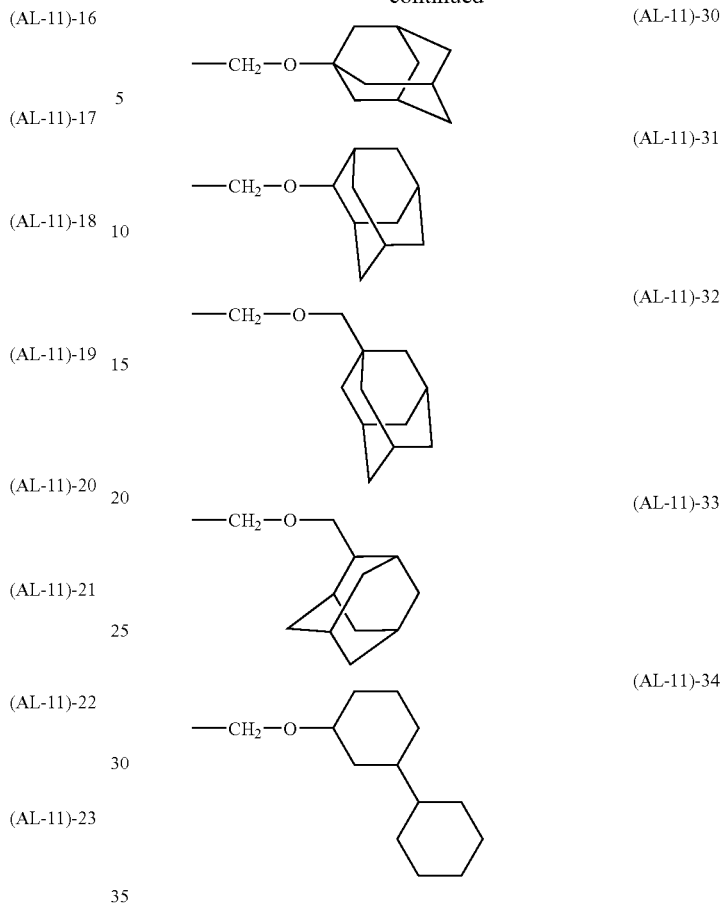

The polymer may be crosslinked within the molecule or between molecules with acid labile groups of formula (AL-11a) or (AL-11b).

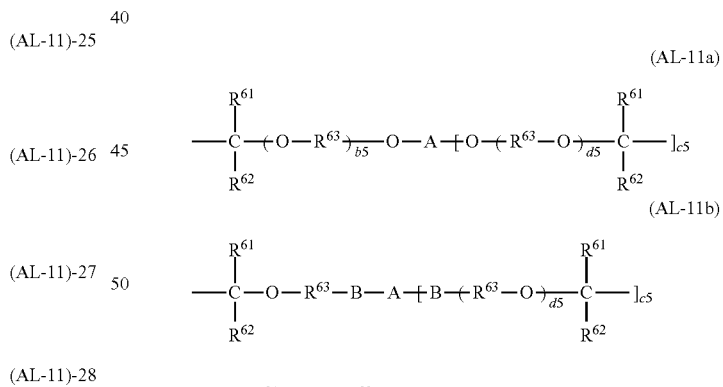

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae through (AL-11)-42.

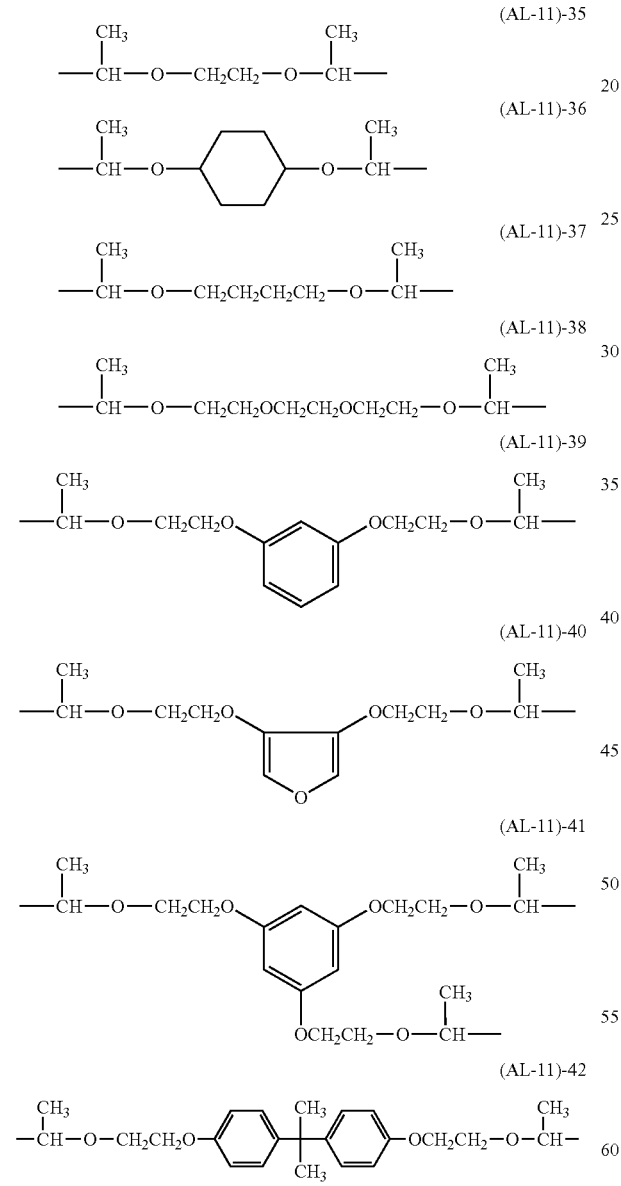

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

-continued

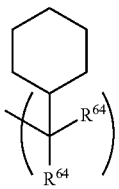
(AL-12)-11

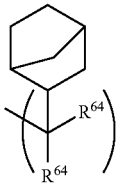
(AL-12)-12

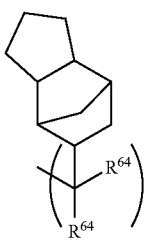
(AL-12)-13

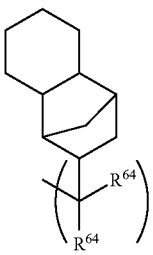
(AL-12)-14

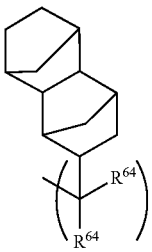
(AL-12)-15

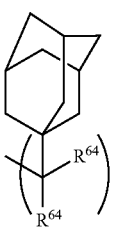
(AL-12)-16

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

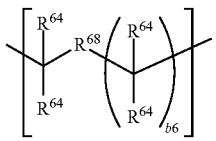
(AL-12)-17

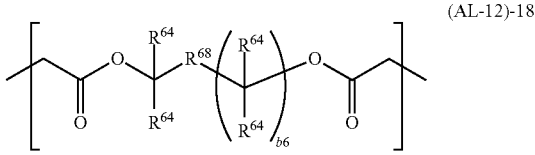
(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH     (AL-13)-1

—(CH$_2$)$_2$O(CH$_2$)$_3$CH$_3$     (AL-13)-2

(AL-13)-3

—(CH$_2$)$_2$O(CH$_2$)$_2$OH     (AL-13)-4

—(CH$_2$)$_6$OH     (AL-13)-5

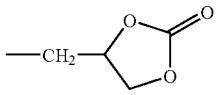
(AL-13)-6

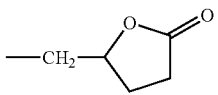
(AL-13)-7

Of the acid labile groups of formula (AL-12), recurring units having an exo-form structure represented by the formula (AL-12)-19 are preferred.

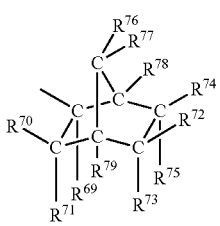
(AL-12)-19

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{74}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring of 3 to 20 carbon atoms, specifically 4 to 16 carbon atoms, and more specifically aliphatic ring of such carbon atoms, and in this case, each group participating in ring formation is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{76}$ which are attached to vicinal carbon atoms may bond together directly to form a double bond. The formula also represents an enantiomer.

The ester form monomers from which recurring units having an exo-form structure represented by the formula (AL-12)-19:

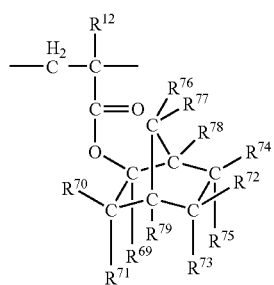

are derived are described in U.S. Pat. No. 6,448,420 (JP-A 2000-327633). Illustrative non-limiting examples of suitable monomers are given below.

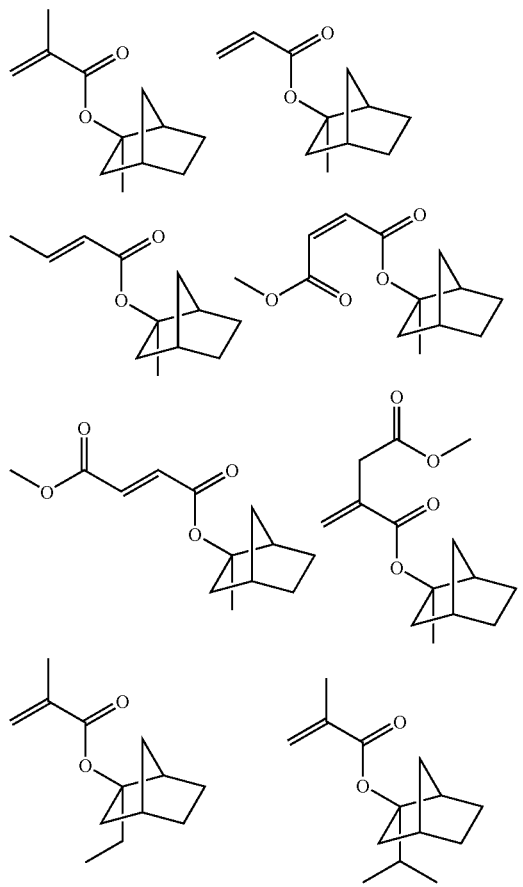

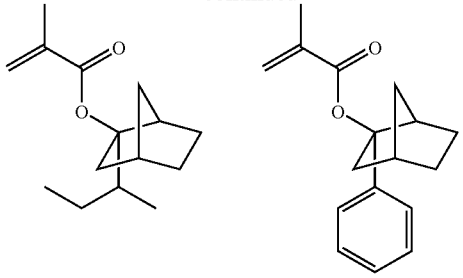
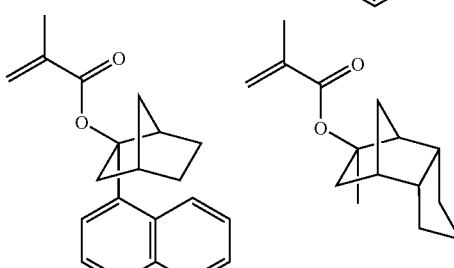
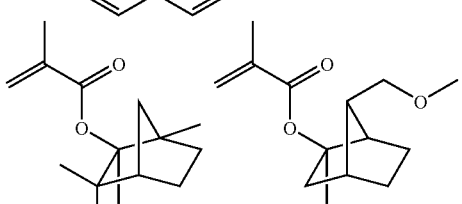
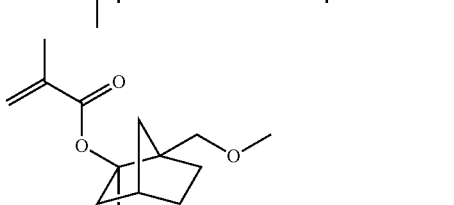
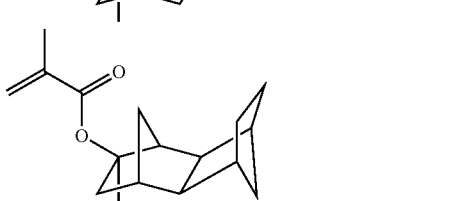
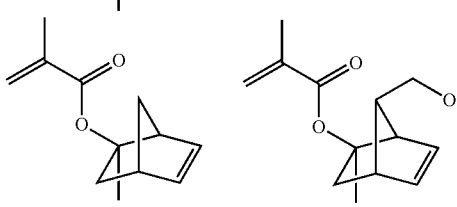
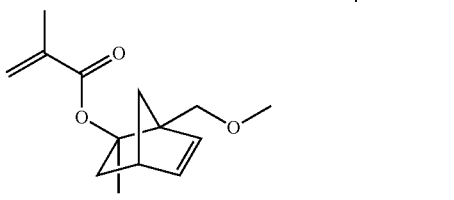
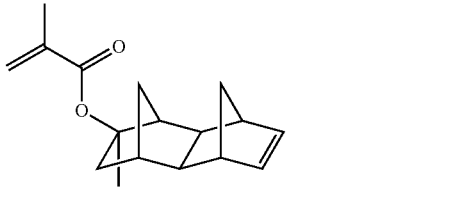

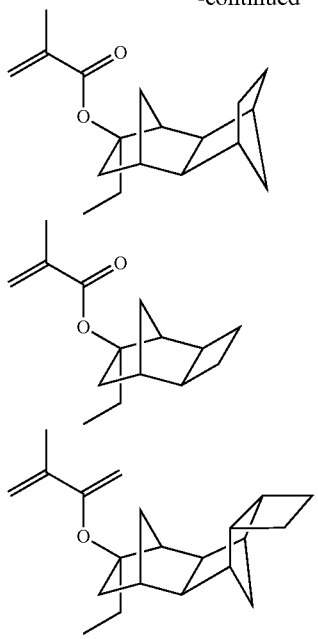

Also included in the acid labile groups of formula (AL-12) are acid labile groups having furandiyl, tetrahydrofurandiyl or oxanorbornanediyl as represented by the following formula (AL-12)-20.

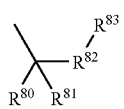
(AL-12)-20

Herein, $R^{80}$ and $R^{81}$ are each independently a monovalent hydrocarbon group, typically a straight, branched or cyclic alkyl of 1 to 10 carbon atoms. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic alkyl of 1 to 10 carbon atoms, which may contain a heteroatom.

Examples of the monomers from which the recurring units substituted with acid labile groups having furandiyl, tetrahydrofurandiyl and oxanorbornanediyl as represented by the formula:

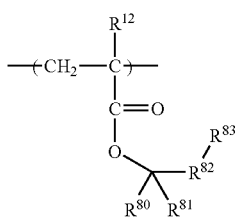

(wherein $R^{80}$, $R^{81}$, $R^{82}$ and $R^{83}$ are as defined above) are derived are shown below. Note that Me is methyl and Ac is acetyl.

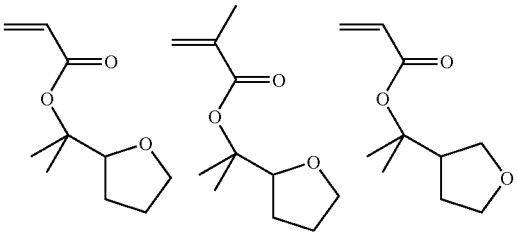
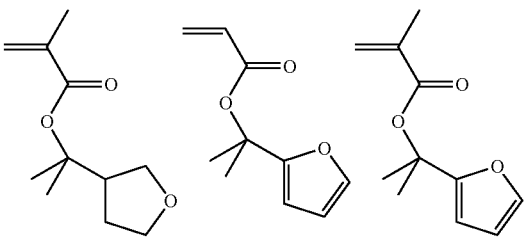
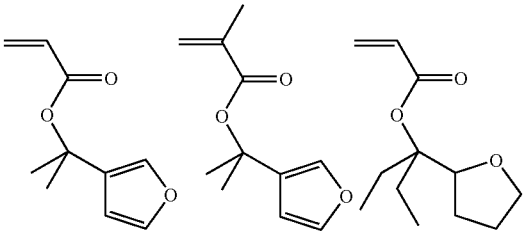
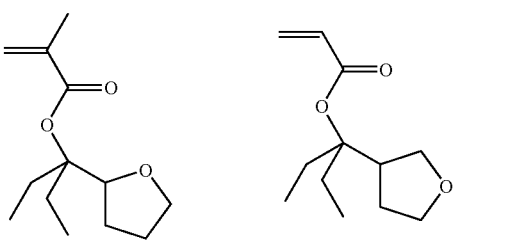
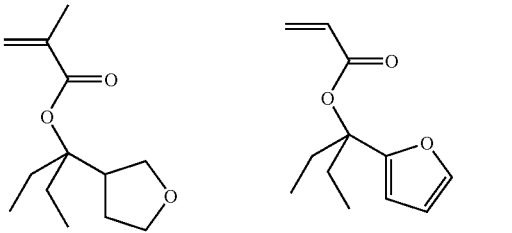
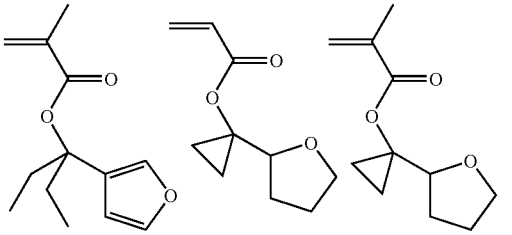
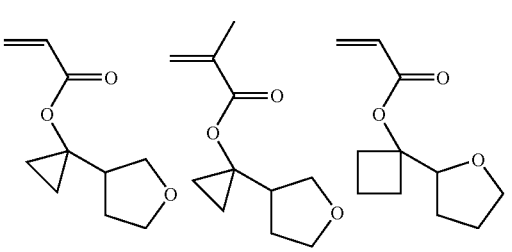

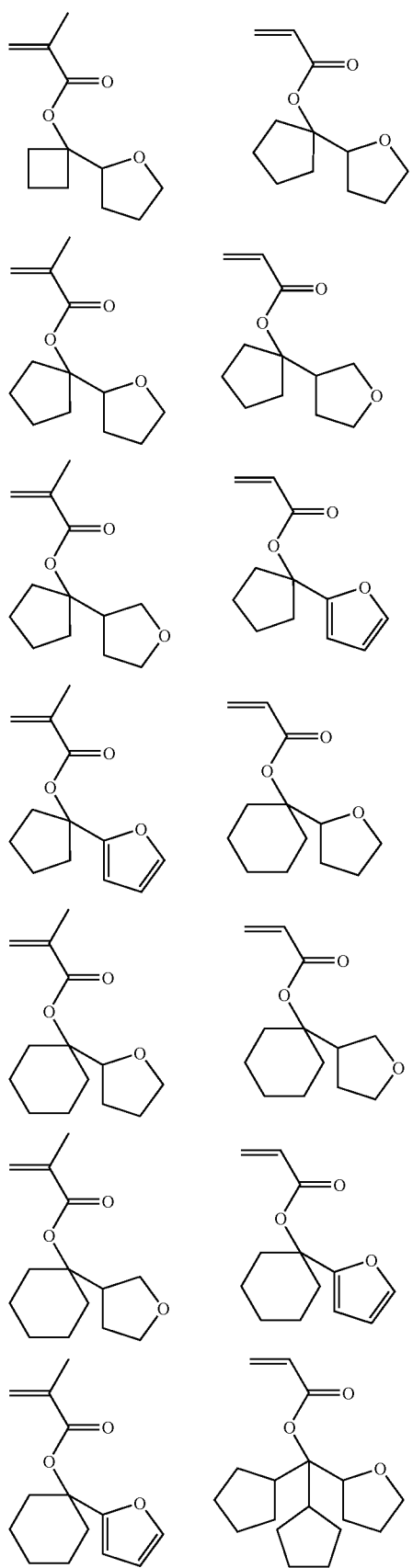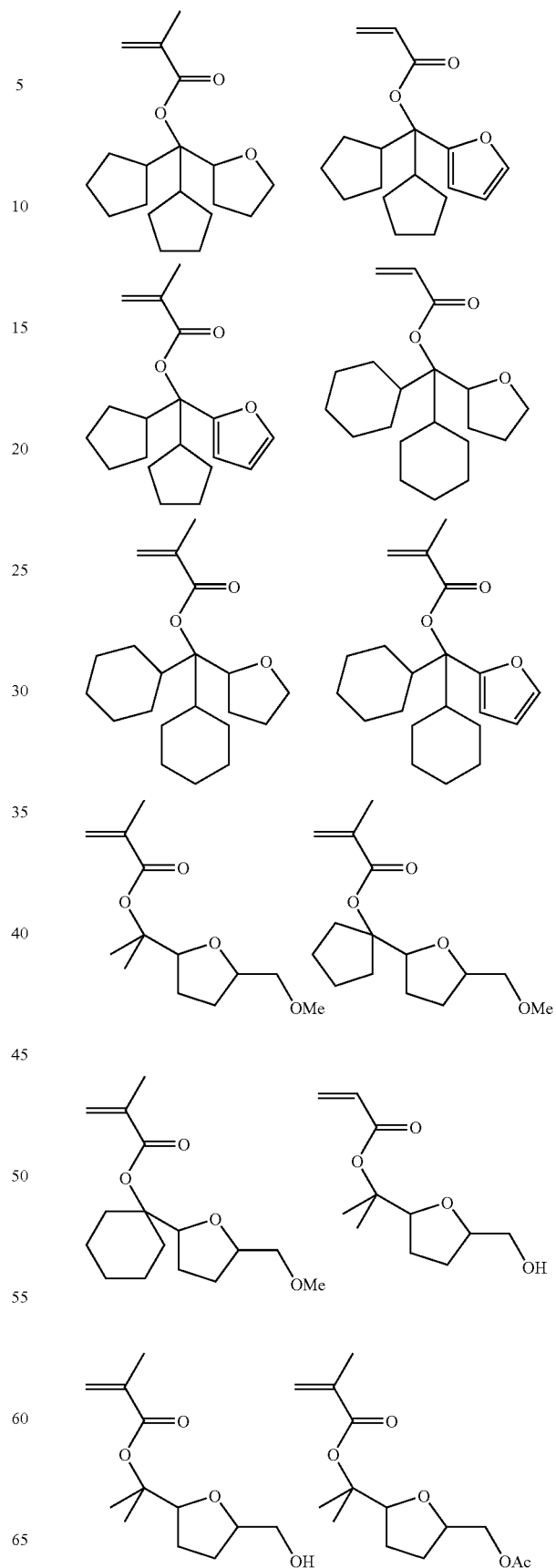

-continued

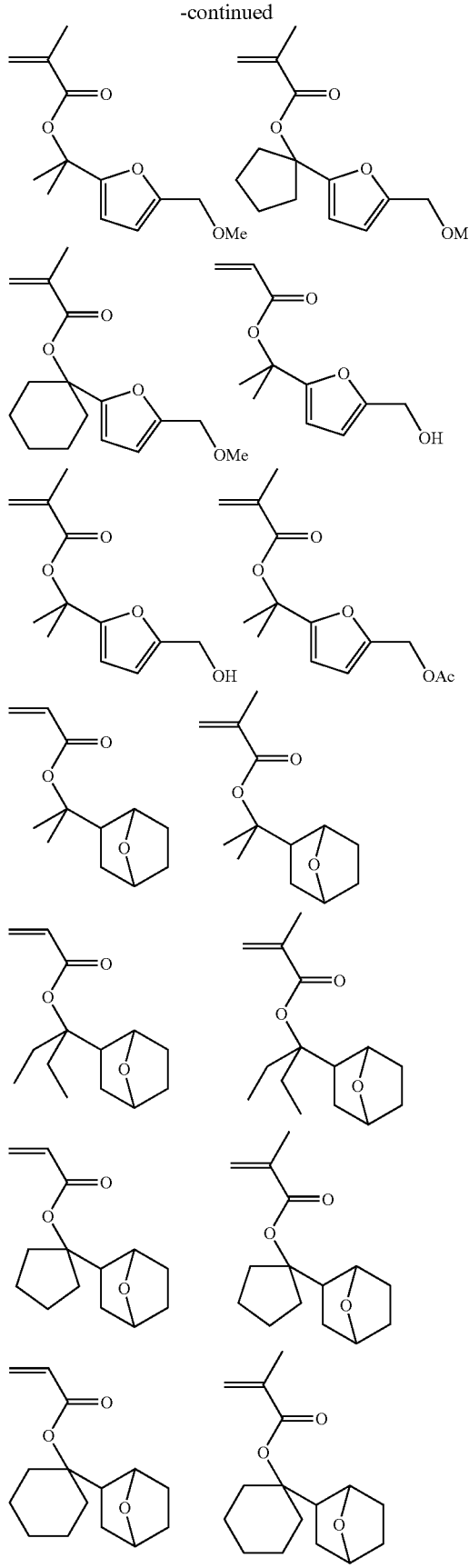

While the polymer used herein preferably includes recurring units of at least one of formulae (a-1) and (a-2) and recurring units of formula (b), it may have copolymerized therein recurring units (c) derived from monomers having adhesive groups such as hydroxy, cyano, carbonyl, ester, ether groups, lactone rings, carbonyl groups or carboxylic anhydride groups. Examples of monomers from which recurring units (c) are derived are given below.

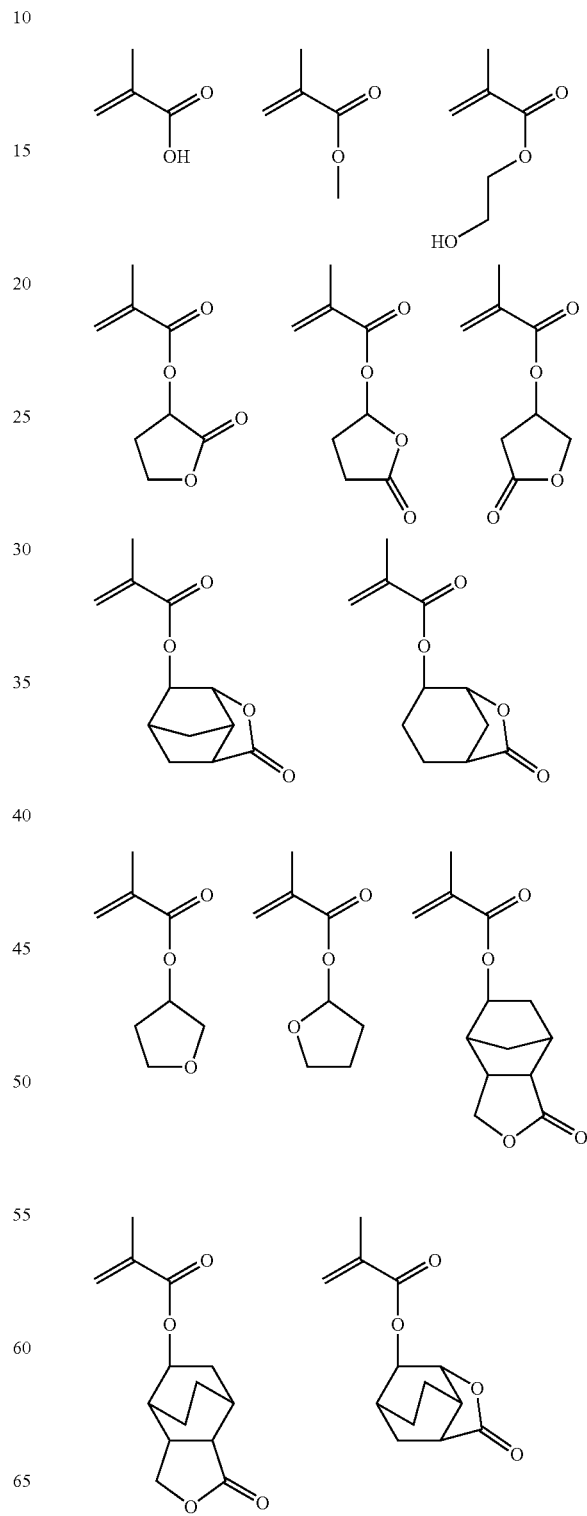

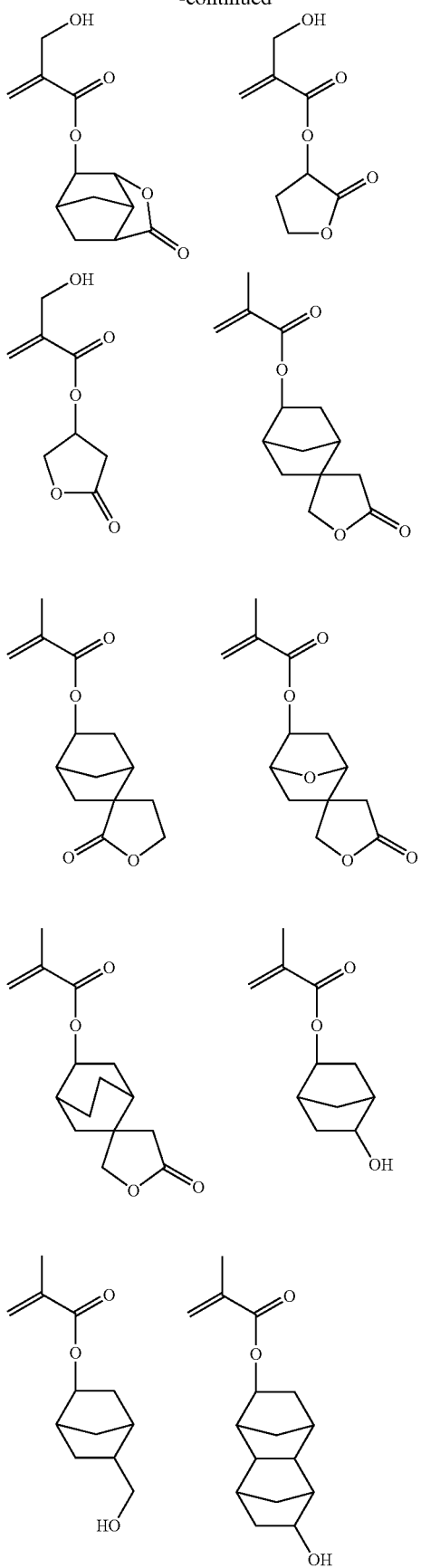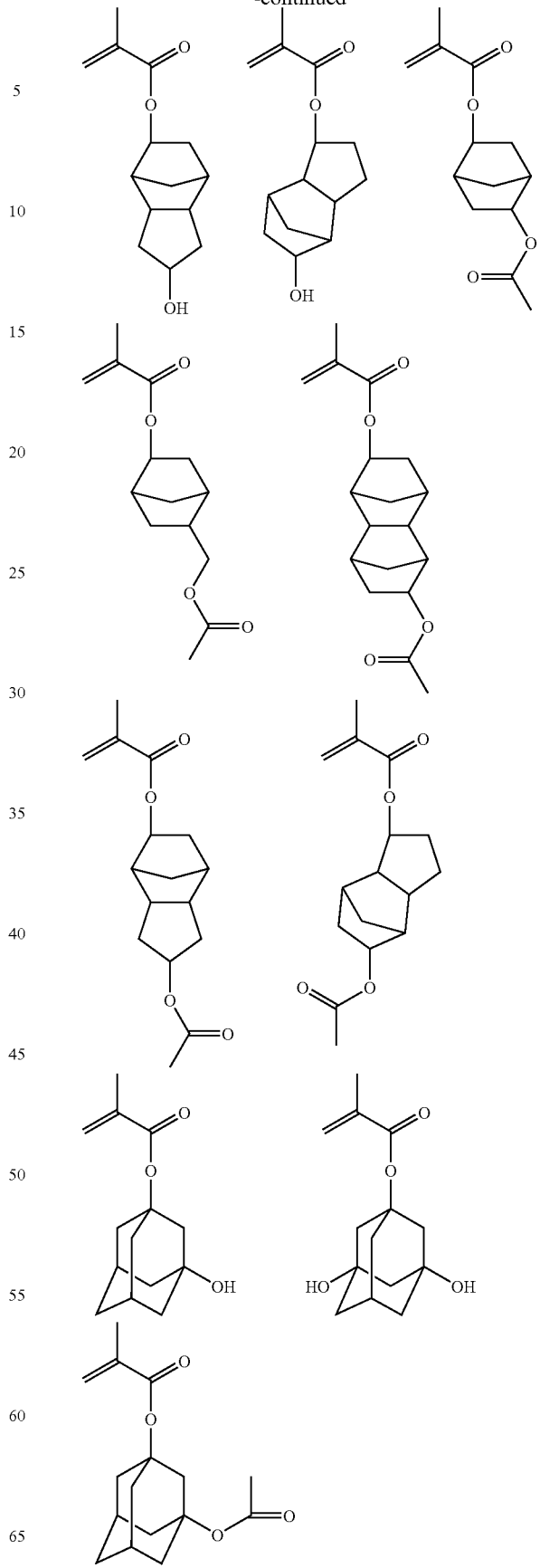

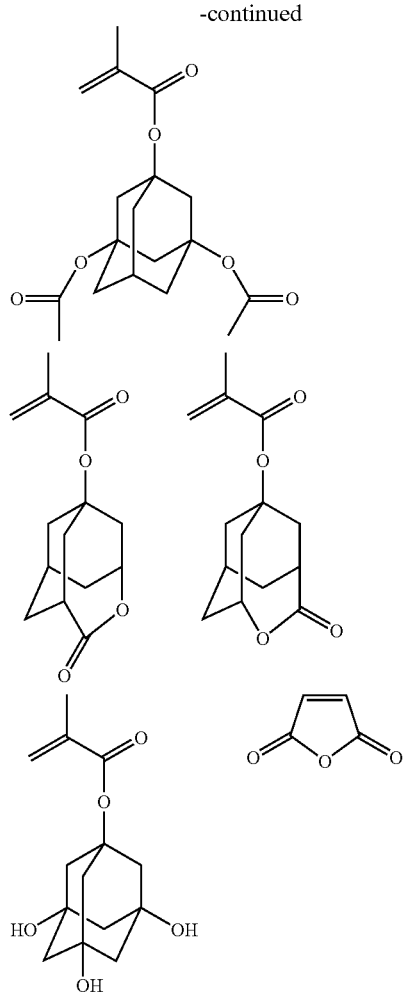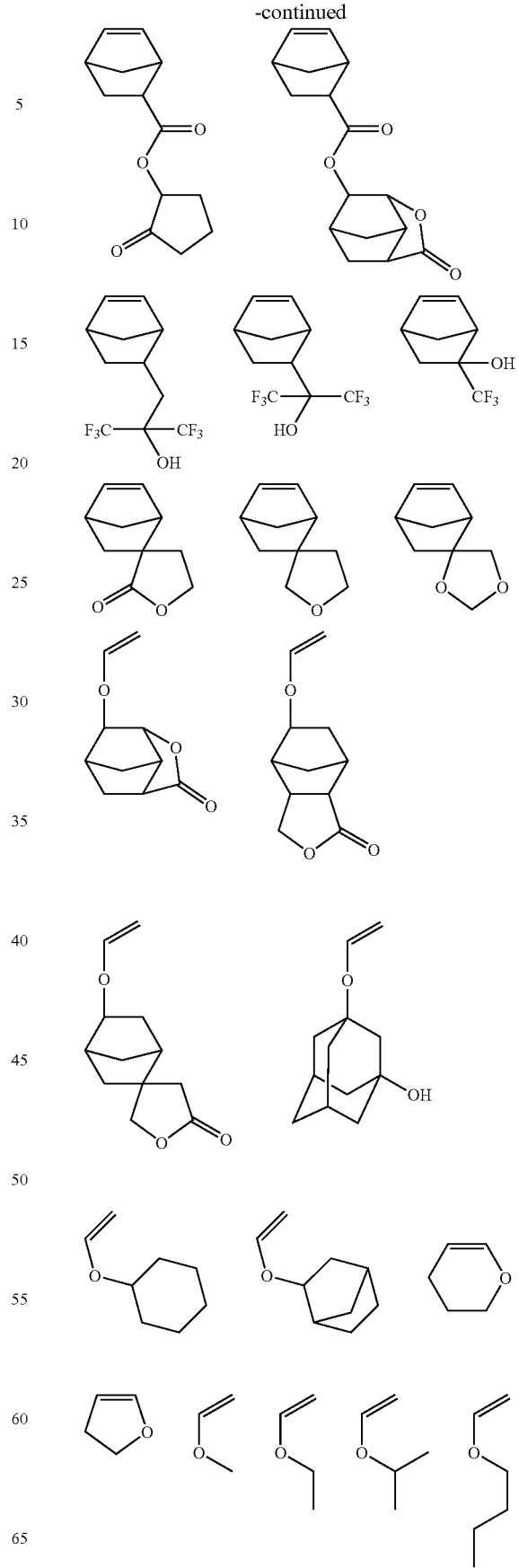

-continued
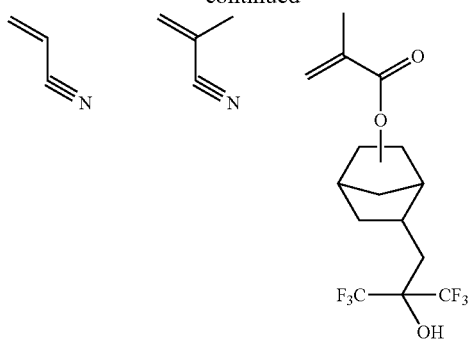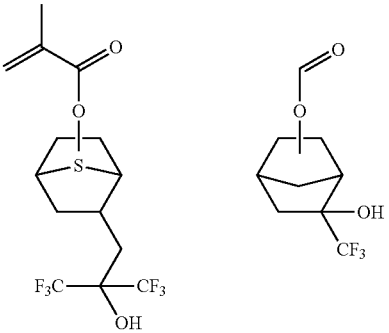
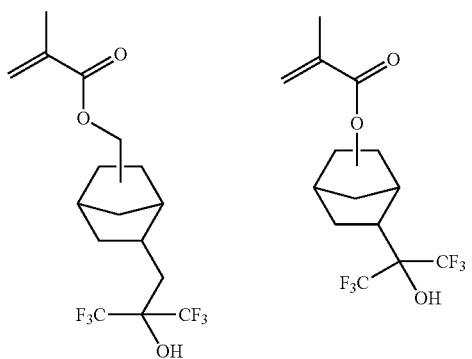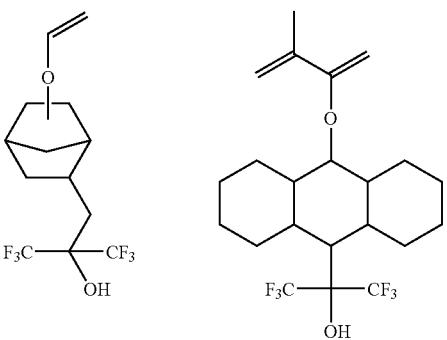
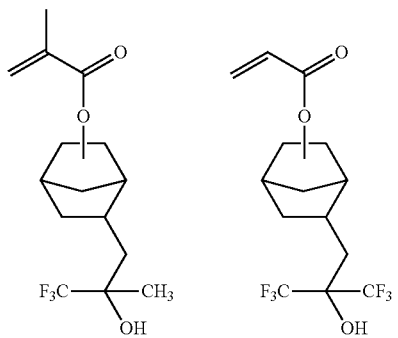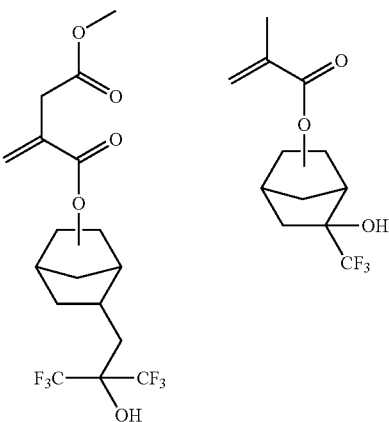
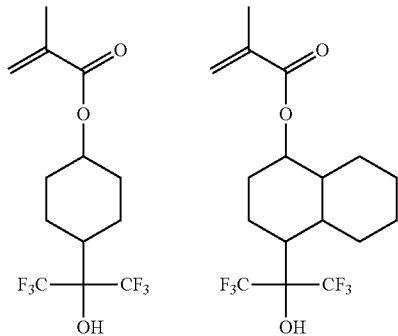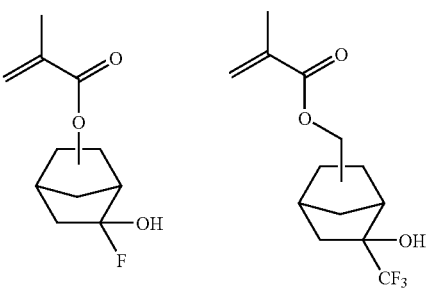
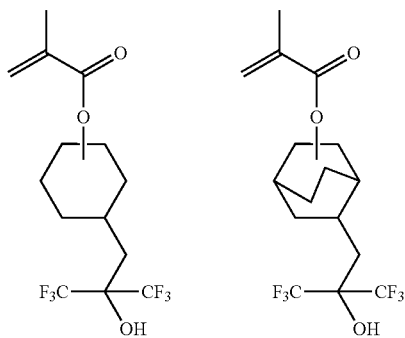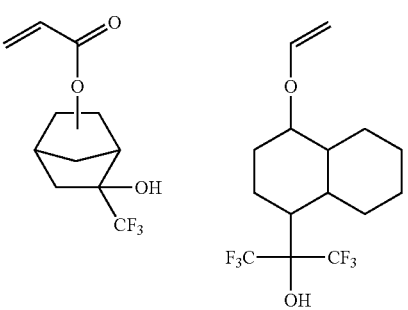

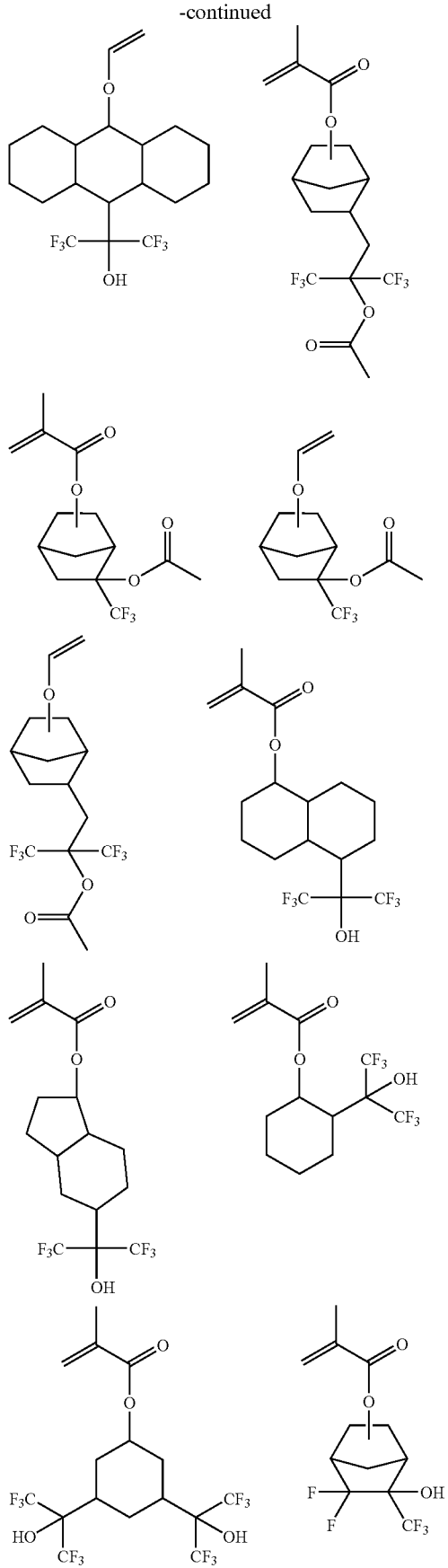
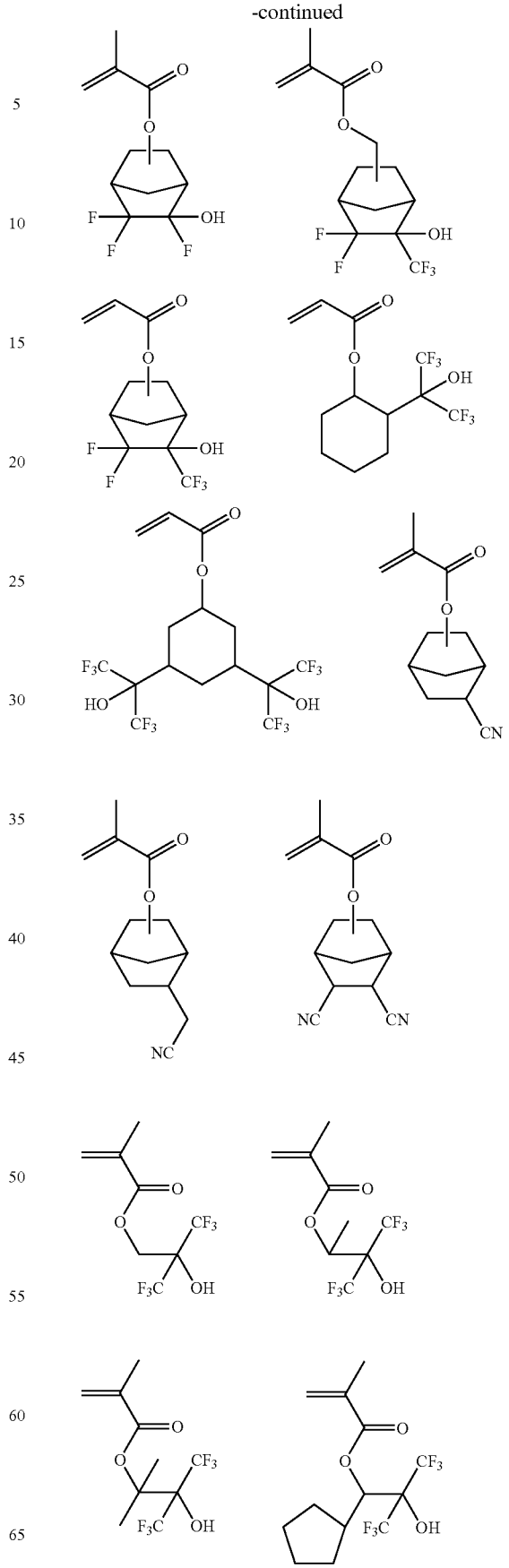

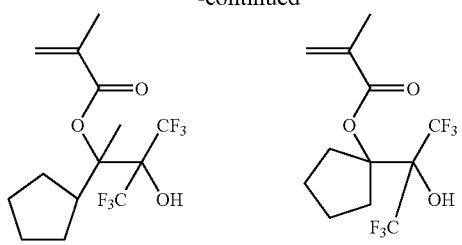
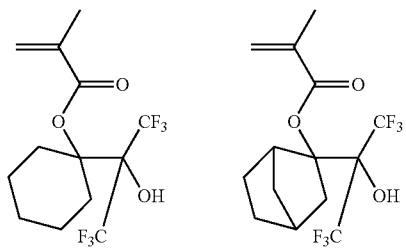
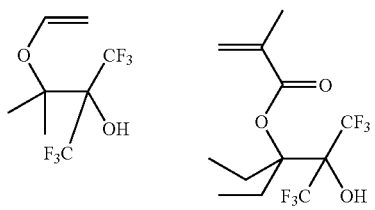
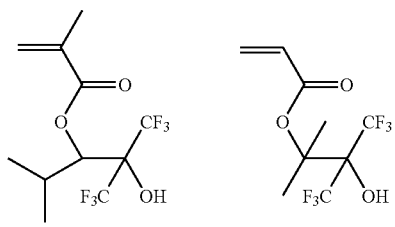
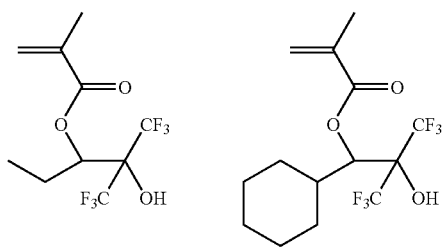
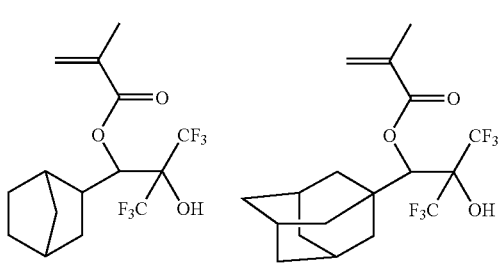
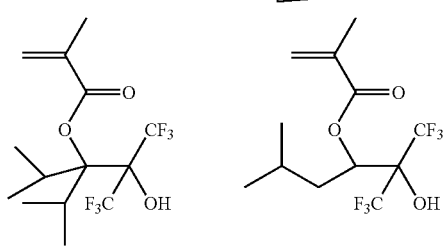
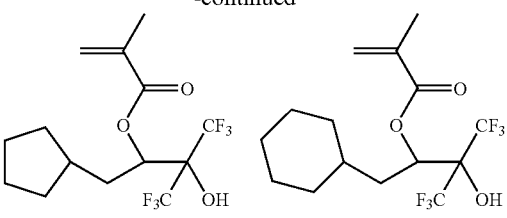
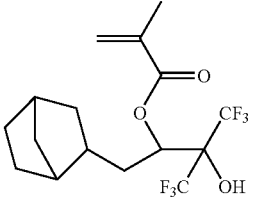
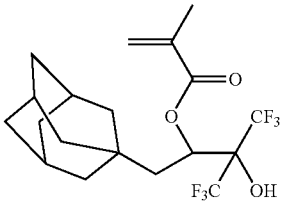
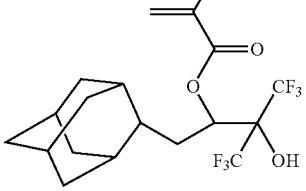
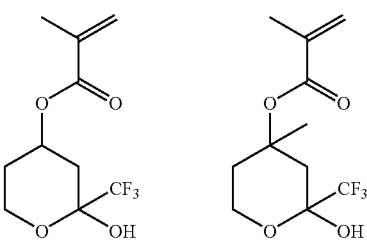
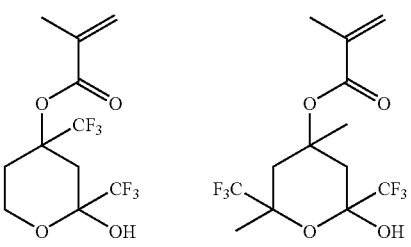
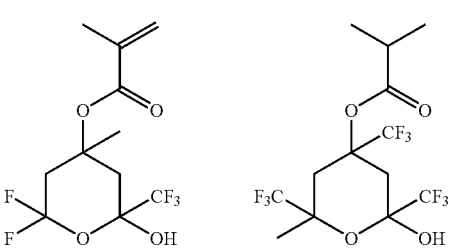

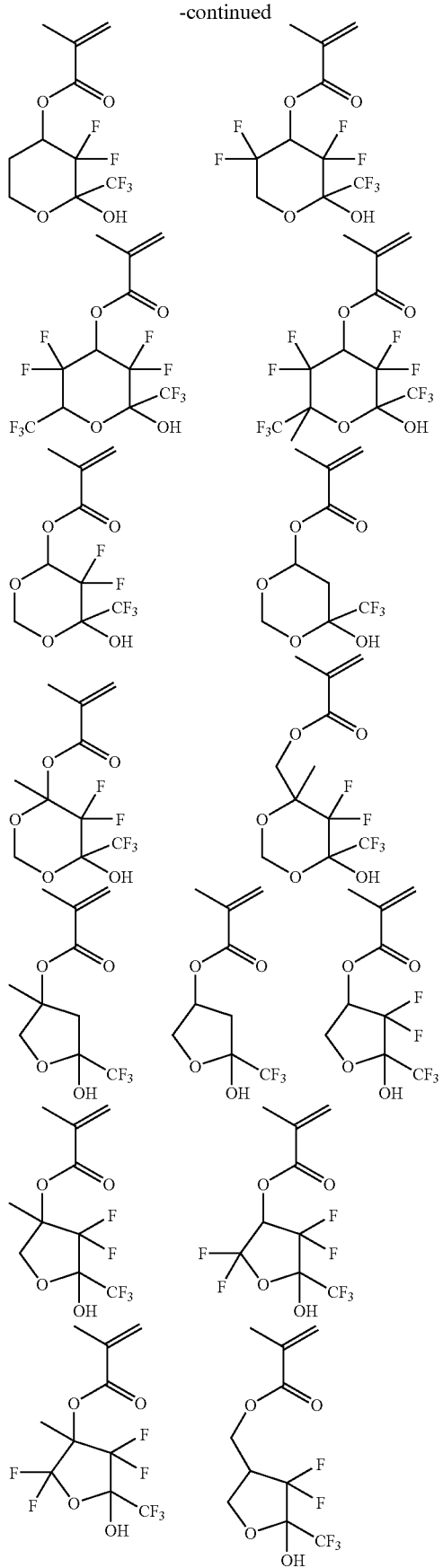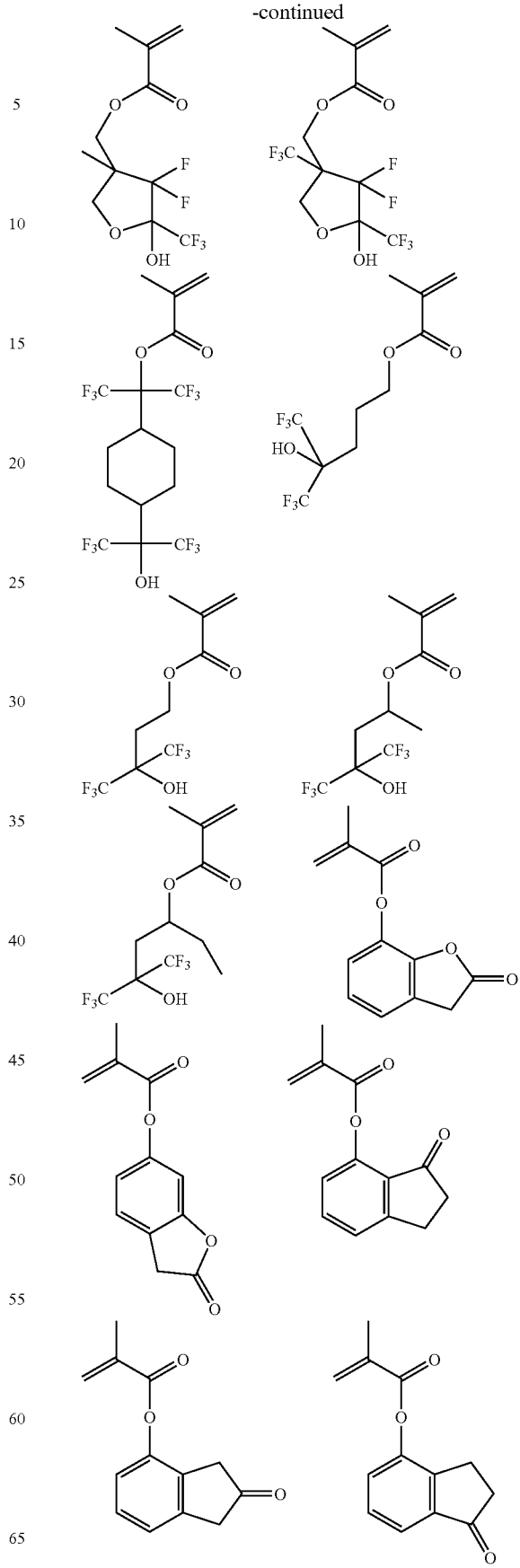

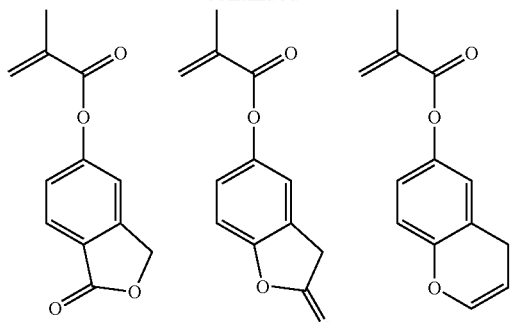
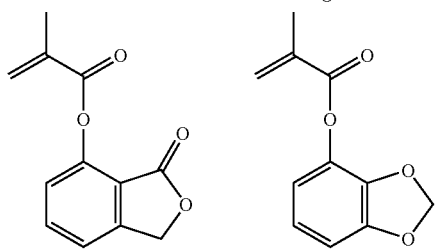
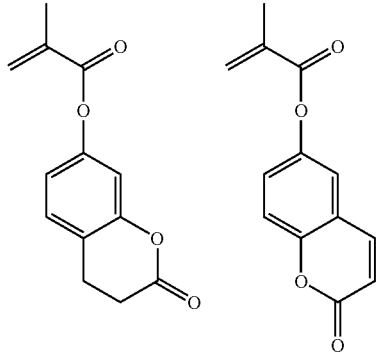
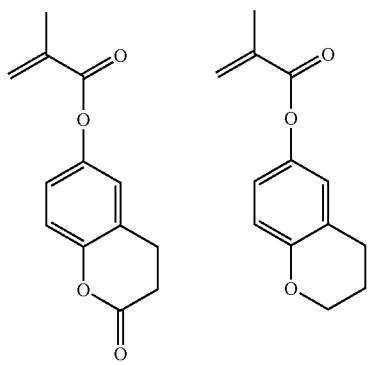
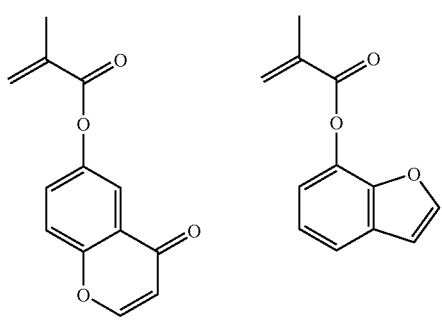

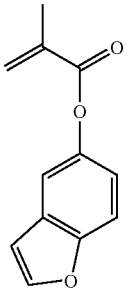
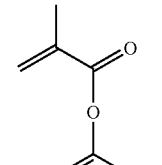
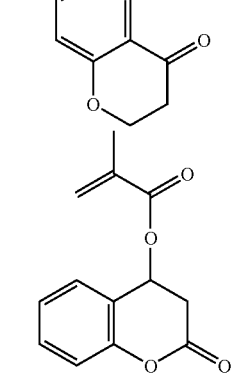
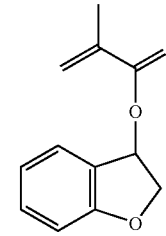

In the polymer of the invention, the recurring units (a1), (a2), (b) and (c) are present in proportions a1, a2, b, and c, respectively, which satisfy the range: 0≤a1<1.0, 0≤a2<1.0, 0<a1+a2<1.0, 0<b≤0.8, 0.1≤a1+a2+b≤1.0, 0≤c<1.0, and a1+a2+b+c=1, and preferably the range: 0≤a1≤0.9, 0≤a2≤0.9, 0.1≤a1+a2≤0.9, 0.1≤b ≤0.7, 0.2≤a1+a2+b≤1.0, and 0≤c≤0.9.

The polymer serving as the base polymer in the resist used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. With too low a Mw, the efficiency of thermal crosslinking in the resist material after development may become low. With too high a Mw, the polymer may lose alkali solubility and give rise to a footing phenomenon after pattern formation.

If a polymer as used in the resist composition has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a1), (a2), (b) and (c) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter protected or partially protected. Notably, the polymer serving as the base resin may be added alone or in admixture of two or more. Inclusion of more than one polymer enables to tailor the resist composition for a particular performance.

Acid Generator

The resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2- tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)

propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenyl-acetonitrile, (5-(10-camphorsulfonyl)oxyimino-5H-thiophen-2-ylidene)phenyl-acetonitrile, (5-n-octanesulfonyloxyimino-5H-thiophen-2-ylidene)phenyl-acetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethyl-phenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methyl-sulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoro-ethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propyl-sulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxy-phenyl]-ethanone oxime-O- propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethane-sulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propane-sulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)phenylsulfonyl-oxyimino)-ethyl)-phenoxy)-propoxy)-phenyl)ethanone oxime(2,5-bis(4-methylphenylsulfonyloxy)benzenesulfonyloxy)-phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylaceto-nitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]aceto-nitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

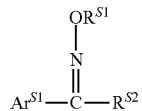

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluoro-butylsulfonyloxyimino)-pentyl]-fluorene, 2-[2,2,3,3,4,4-pentafluoro-1-(nonafluorobutylsulfonyloxy-imino)-butyl]-fluorene, 2-[2,2,3,3,4,4,5,5,6,6-decafluoro-1-(nonafluorobutylsulfonyl-oxyimino)-hexyl]-fluorene, 2-[2,2,3,3,4,4,5,5-octafluoro-1-(nonafluorobutylsulfonyloxy-imino)-pentyl]-4-biphenyl, 2-[2,2,3,3,4,4-pentafluoro-1-(nonafluorobutylsulfonyloxy-imino)-butyl]-4-biphenyl, and 2-[2,2,3,3,4,4,5,5,6,6-decafluoro-1-(nonafluorobutylsulfonyl-oxyimino)-hexyl]-4-biphenyl.

Suitable bisoxime sulfonates include those described in JP-A 9-208554, for example, bis(α-(4-toluenesulfonyloxy) imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis (α-(10-camphorsulfonyloxy)imino)-p-phenylenediacetonitrile, bis(α-(4-toluenesulfonyloxy) imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediaceto-nitrile, bis(α-(4-toluenesulfonyloxy) imino)-m-phenylenediacetonitrile, bis(α-(benzenesulfonyloxy)imino)-m-phenylenediacetonitrile, bis (α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy) imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyl-oxy) benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butane-sulfonate, 4-tert-butylphenyldiphenylsulfonium pentafluoroethyl-perfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy) phenylsulfonyl)diazomethane, bis(2-methyl-4-(n-hexyloxy) phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxy-imino)-pentyl]-fluorene, 2-[2,2,3,3,4,4-pentafluoro-1-(nonafluorobutylsulfonyloxy-imino)-butyl]-fluorene, and 2-[2,2,3,3,4,4,5,5,6,6-decafluoro-1-(nonafluorobutylsulfonyl-oxyimino)-hexyl]-fluorene.

In the resist composition, an appropriate amount of the photoacid generator is, but not limited to, 0.1 to 20 parts, and more specifically 0.1 to 10 parts by weight per 100 parts by weight of the base resin. Up to 20 pbw of the photoacid generator permits the photoresist film to have a sufficient transmittance and thus minimizes the risk of resolution degradation. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and especially up to 1 part by weight per 100 parts by weight of the base resin. Up to 2 pbw of the acid-amplifier compound minimizes the risk of controlled diffusion leading to degradation of resolution and pattern profile.

Moreover, the resist composition may further include at least one of an organic solvent, basic compound, dissolution regulator, and surfactant.

Organic Solvent

The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base resin in the resist composition.

Nitrogen-Containing Compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

(B)-1

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

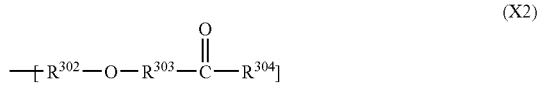

In the formulas, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups, which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]

amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

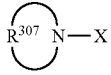
(B)-2

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

(B)-3

(B)-4

(B)-5

(B)-6

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2- formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

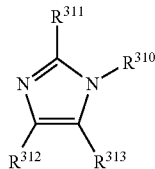
(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

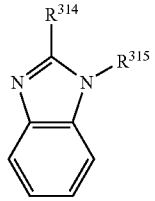
(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

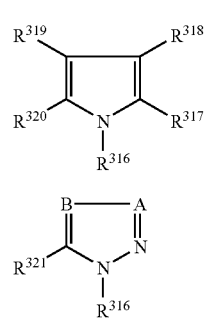
(B)-9

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$ may bond together to form a benzene, naphthalene or pyridine ring with the carbon atom to which they are attached; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring with the carbon atom to which they are attached.

Also included are organic nitrogen-containing compounds of aromatic carboxylic ester structure having the general formulae (B)-11 to (B)-14.

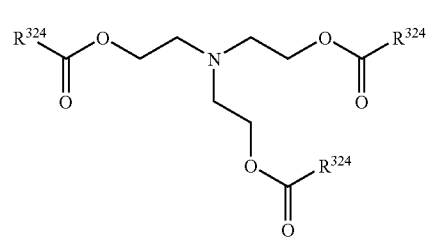
(B)-11

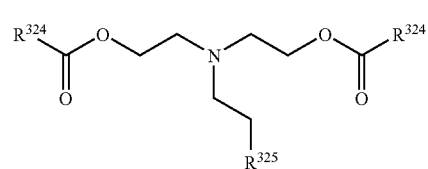
(B)-12

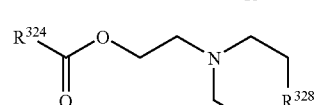
(B)-13

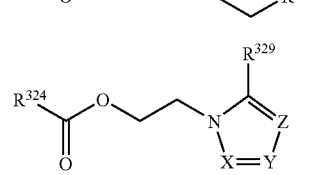
(B)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O($CH_2CH_2O$)$_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ heteroaromatic ring with the carbon atoms to which they are attached.

Further included are organic nitrogen-containing compounds of 7-oxanorbornane-2-carboxylic ester structure having the general formula (B)-15.

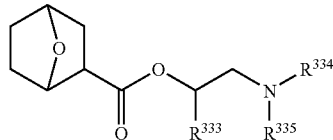

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin. At least 0.001 pbw of the nitrogen-containing compound achieves a certain addition effect whereas up to 2 pbw minimizes the risk of lowering sensitivity.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

In the resist composition, other components including dissolution regulators, carboxylic acids, and acetylene alcohol derivatives may be optionally added. Optional components may be added in conventional amounts so long as this does not compromise the objects of the invention.

Dissolution Regulator

The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Independent of whether or not the phenol groups are substituted with acid labile groups, the acid labile groups are deprotected by baking after development, allowing the phenol groups to contribute to an accelerated cure reaction.

Preferable examples of such compounds having two or more phenolic hydroxyl groups or compounds having at least one carboxyl group include those of formulas (D1) to (D14) below.

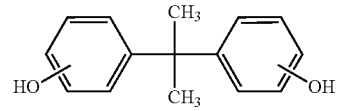

(D1)

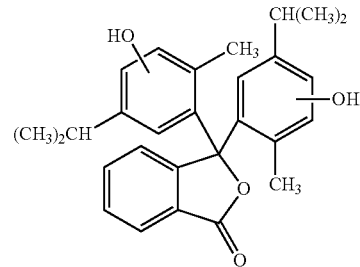

(D2)

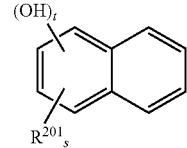

(D3)

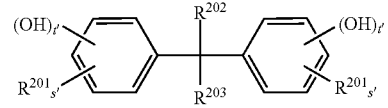

(D4)

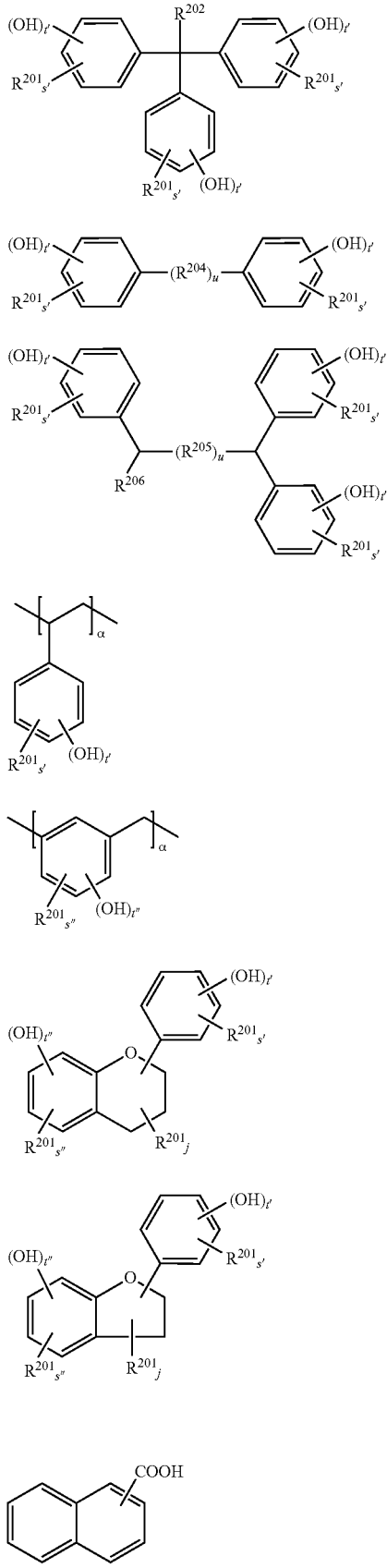
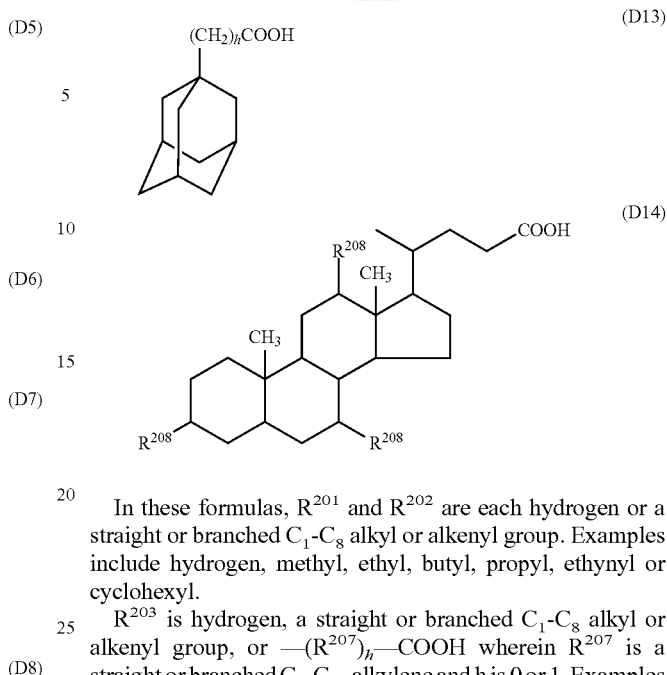

In these formulas, $R^{201}$ and $R^{202}$ are each hydrogen or a straight or branched $C_1$-$C_8$ alkyl or alkenyl group. Examples include hydrogen, methyl, ethyl, butyl, propyl, ethynyl or cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene and h is 0 or 1. Examples include those exemplified for $R^{201}$ and $R^{202}$ as well as —COOH and —CH$_2$COOH.

$R^{204}$ is —(CH$_2$)$_i$— (wherein i=2 to 10), a $C_6$-$C_{10}$ arylene, carbonyl, sulfonyl, an oxygen atom, or a sulfur atom. Examples include ethylene, phenylene, carbonyl, sulfonyl, oxygen or sulfur.

$R^{205}$ is a $C_1$-$C_{10}$ alkylene, a $C_6$-$C_{10}$ arylene, carbonyl, sulfonyl, an oxygen atom, or a sulfur atom. Examples include methylene and those exemplified for $R^{204}$.

$R^{206}$ is hydrogen, a straight or branched $C_1$-$C_8$ alkyl or alkenyl, or a hydroxyl-substituted phenyl or naphthyl. Examples include hydrogen, methyl, ethyl, butyl, propyl, ethynyl, and cyclohexyl, as well as hydroxy-substituted phenyl and naphthyl groups.

$R^{208}$ is hydrogen or hydroxyl. The letter j is an integer from 0 to 5; u and h are each equal to 0 or 1; s, t, s', t', s'', and t'' are each numbers which satisfy s+t=8, s'+t'=5, and s''+t''=4, and are such that each phenyl structure has at least one hydroxyl group; and α is a number such that the compounds of formula (D8) or (D9) have a molecular weight of from 100 to 1,000.

The acid labile group in the dissolution regulator may be selected from a variety of such groups, for example, groups of formulae (AL-10) and (AL-11) shown above, tertiary $C_4$-$C_{20}$ alkyl groups, trialkylsilyl groups in which each alkyl moiety has 1 to 6 carbon atoms, and $C_4$-$C_{20}$ oxoalkyl groups. Illustrative examples of these groups are as previously described.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. Up to 50 pbw of the dissolution regulator has a minimized risk of slimming the patterned film to invite a decline of resolution.

The dissolution regulator can be synthesized by introducing acid labile groups into a compound having phenolic hydroxyl or carboxyl groups in accordance with an organic chemical formulation.

In the positive resist composition, a carboxylic acid may be blended. Exemplary, non-limiting carboxylic acids include one or more compounds selected from Groups I and II below.

Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups have been replaced by —$R^{401}$—COOH (wherein $R^{401}$ is a straight or branched $C_1$-$C_{10}$ alkylene), and in which the molar ratio C/(C+D) of phenolic hydroxyl groups (C) to ≡C—COOH groups (D) in the molecule is from 0.1 to 1.0.

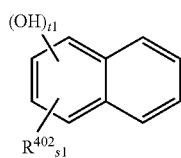 (A1)

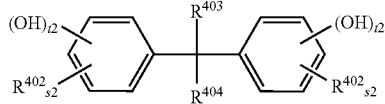 (A2)

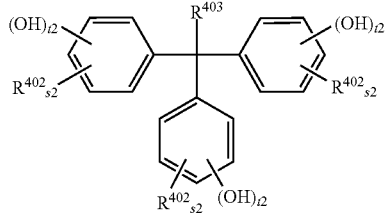 (A3)

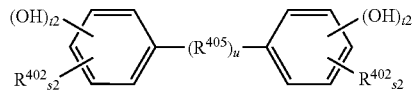 (A4)

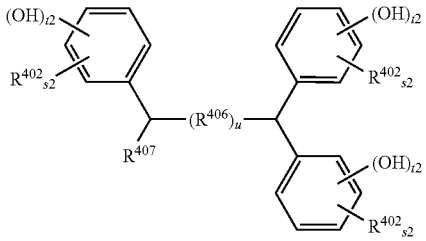 (A5)

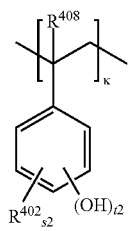 (A6)

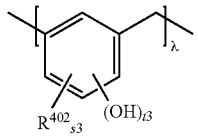 (A7)

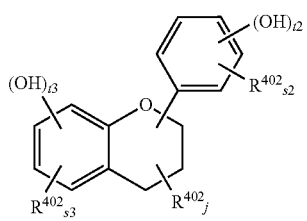 (A8)

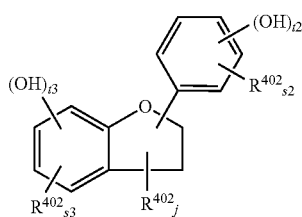 (A9)

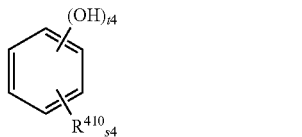 (A10)

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; j is an integer of 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A10) to (A15) below.

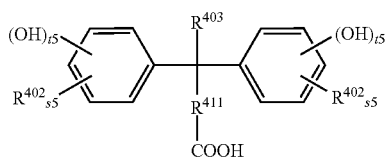 (A11)

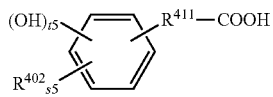 (A12)

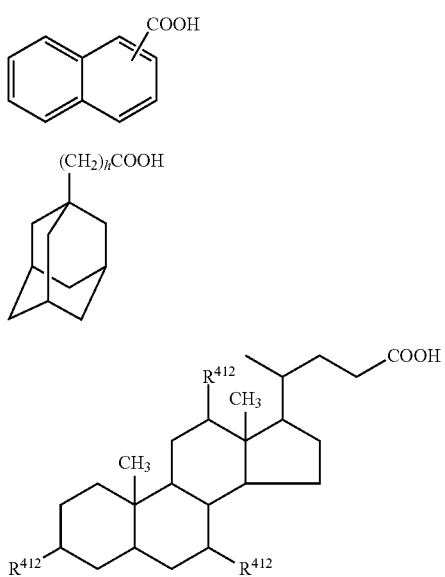
(A13)
(A14)
(A15)

In these formulas, $R^{402}$, $R^{403}$, and $R^{411}$ are as defined above; $R^{412}$ is hydrogen or hydroxyl; s5 and t5 are numbers which satisfy s5≥0, t5≥0, and s5+t5=5; and h is an integer of 1 to 4.

Illustrative, non-limiting examples of the compound having a carboxyl group include compounds of the general formulas AI-1 to AI-14 and AII-1 to AII-10 below.

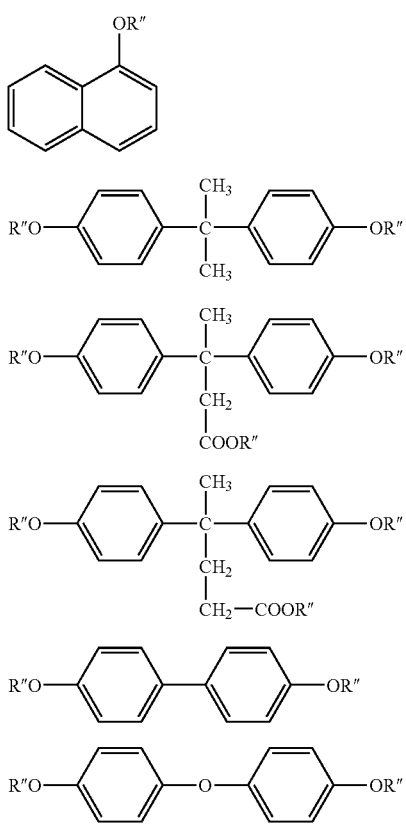
(AI-1)
(AI-2)
(AI-3)
(AI-4)
(AI-5)
(AI-6)

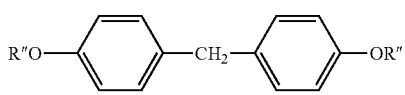
(AI-7)

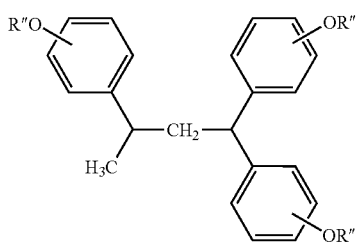
(AI-8)

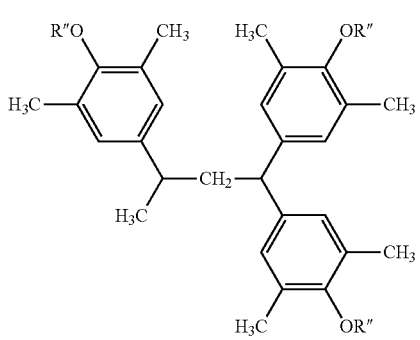
(AI-9)

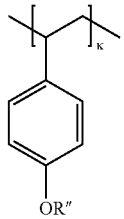
(AI-10)

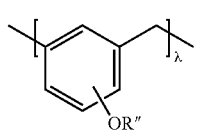
(AI-11)

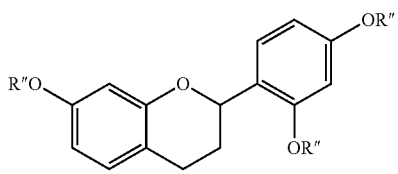
(AI-12)

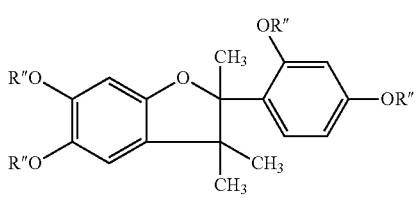
(AI-13)

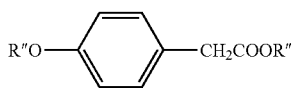
(AI-14)

In the above formulas, R″ is hydrogen or a —CH₂COOH group such that the —CH₂COOH group accounts for 10 to 100 mol % of R″ in each compound, κ and λ are as defined above.

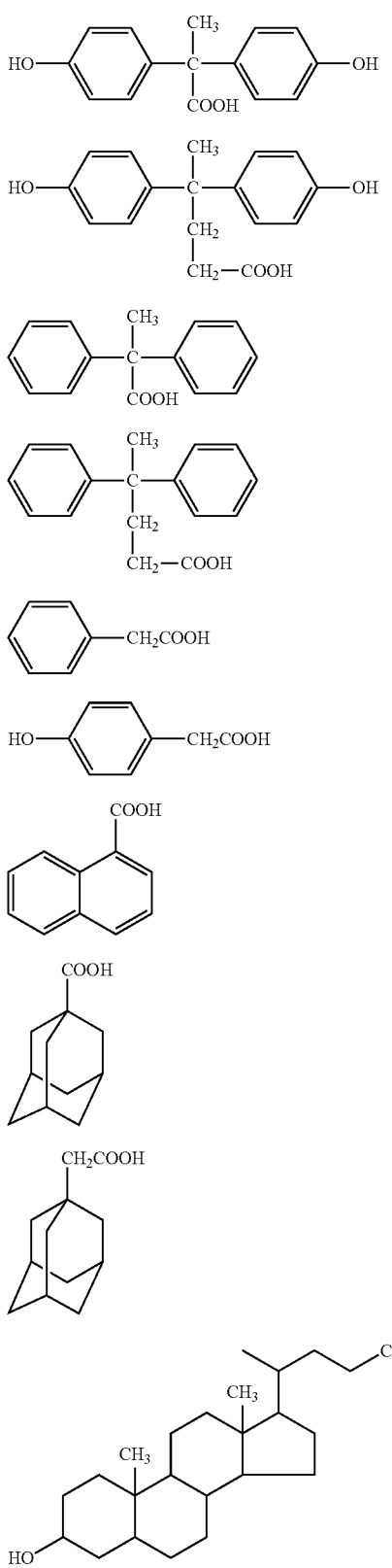

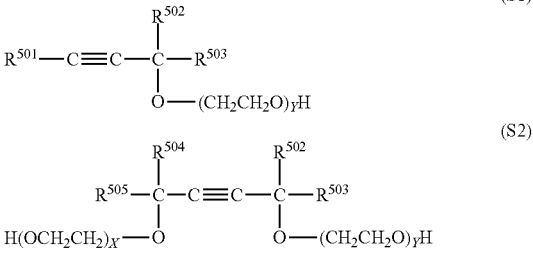

The compound having a group =C—COOH in the molecule is added in an amount ranging from 0 to 5 parts, preferably 0.1 to 5 parts, more preferably 0.1 to 3 parts, further preferably 0.1 to 2 parts by weight, per 100 parts by weight of the base resin. Up to 5 pbw of the compound has a minimized risk of reducing the resolution of the resist composition.

To the resist composition, an acetylene alcohol derivative may be added. Preferred are acetylene alcohol derivatives having the general formula (S1) or (S2) below.

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is specifically added in an amount of 0.01 to 2% by weight, and more specifically 0.02 to 1% by weight of the resist composition. At least 0.01 wt % of the derivative is fully effective for improving coating characteristics and shelf stability whereas up to 2 wt % of the derivative has a minimized risk of reducing the resolution of the resist composition.

Process

Now, the double patterning process is described.

FIGS. 1 to 3 illustrate prior art processes. One exemplary double patterning process 1 is illustrated in FIG. 1. A photoresist film 30 is coated and formed on a processable substrate 20 on a substrate 10. To prevent the photoresist pattern from collapsing, the technology intends to reduce the thickness of photoresist film. One approach taken to compensate for a lowering of etch resistance of thinner film is to process the processable substrate using a hard mask. The double patterning process illustrated in FIG. 1 uses a multilayer coating in which a hard mask 40 is laid between the photoresist film 30 and the processable substrate 20 as shown in FIG. 1-A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON or p-Si, for example. The resist material used in double patterning process 1 is a positive resist composition. In the process, the resist film 30 is exposed and developed (FIG. 1-B), the hard mask 40 is then dry etched (FIG. 1-C), the photoresist film is stripped, and a second photoresist film 50 is coated, formed, exposed, and developed (FIG. 1-D). Then the processable substrate 20 is dry etched (FIG. 1-E). Since this etching is performed using the hard mask pattern and the second photoresist pattern as a mask, variations occur in the pattern size after etching of the processable substrate due to a difference in etch resistance between hard mask 40 and photoresist film 50.

To solve the above problem, a double patterning process 2 illustrated in FIG. 2 involves laying two layers of hard mask 41 and 42. The upper layer of hard mask 42 is processed using a first resist pattern, the lower layer of hard mask 41 is processed using a second resist pattern, and the processable substrate is dry etched using the two hard mask patterns. It is essential to establish a high etching selectivity between first hard mask 41 and second hard mask 42. Thus the process is rather complex.

FIG. 3 illustrates a double patterning process 3 using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials.

The double patterning processes 1 to 3 described above have the drawback that two hard mask etchings are involved.

FIG. 4 illustrates a double patterning process of the invention. As in FIG. 1-A, a photoresist film 30 of positive resist material is formed on a processable substrate 20 on a substrate 10 via a hard mask 40 (FIG. 4-A). The resist film 30 is then exposed and developed (FIG. 4-B). Then the resist film 30 is crosslinked and cured by irradiation of light with up to 180 nm wavelength, forming a crosslinked resist film 30a (FIG. 4-C). After the light irradiation, baking may be performed to promote crosslinking, yielding a robust film. Further, a second resist material is coated thereon to form a resist film 50, which is exposed and developed to form a pattern of second photoresist film 50 in the space area of the pattern of resist film 30, i.e., crosslinked resist film 30a (FIG. 4-D). Then the hard mask 40 is etched (FIG. 4-E). The processable substrate 20 is dry etched, and finally, the crosslinked resist film 30a and second resist film 50 are removed (FIG. 4-F).

Figure 5A:
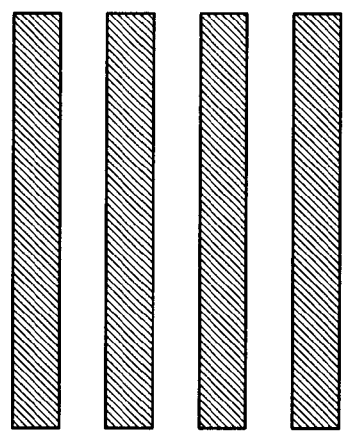
FIG. 5 is a plan view of an exemplary double patterning process in one embodiment of the invention, FIG. 5-A showing a first pattern being formed, and FIG. 5-B showing a second pattern being formed so as to cross the first pattern.
Figure 5B:
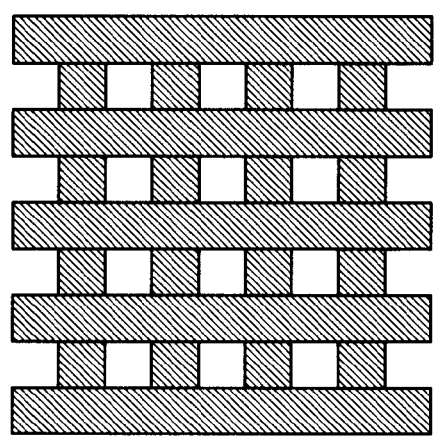
Figure 6A:
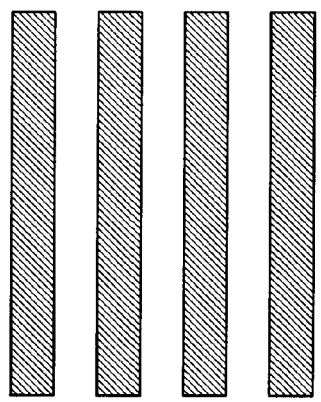
FIG. 6 is a plan view of an exemplary double patterning process in another embodiment of the invention, FIG. 6-A showing a first pattern being formed, and FIG. 6-B showing a second pattern being formed in the space area where the first pattern is absent.
Figure 6B:
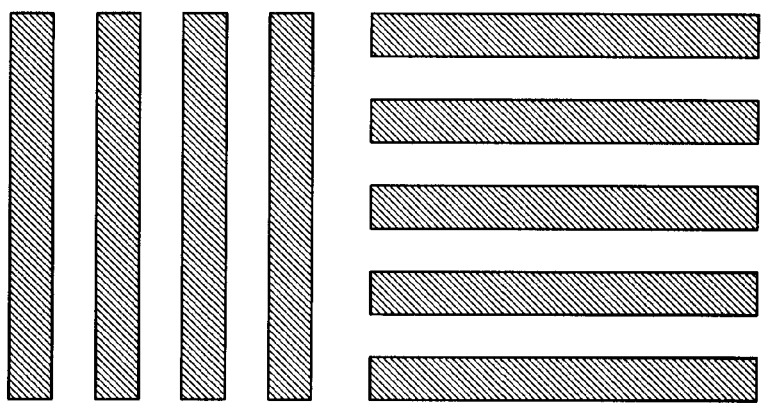

Although the process illustrated in FIG. 4 forms the second pattern between lines of the first pattern, it is also acceptable to form the second pattern so as to cross the first pattern orthogonally as shown in FIG. 5. Although such a pattern may be formed through a single exposure step, an orthogonal line pattern may be formed at a very high contrast by a combination of dipolar illumination with polarized illumination. Specifically, pattern lines in Y direction are formed as shown in FIG. 5A and then insolubilized by the process of the invention. Thereafter, a second resist is coated and processed to form pattern lines in X direction as shown in FIG. 5B. Combining X and Y lines defines a grid pattern while empty areas become holes. The pattern that can be formed by such a process is not limited to the orthogonal pattern, and may include a T-shaped pattern (not shown) or a separated pattern as shown in FIG. 6B.

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above.

In the process of the invention, a resist film of positive resist material is formed on the processable substrate directly or via the intermediate intervening layer. The resist film preferably has a thickness of 10 to 1,000 nm, and more preferably 20 to 500 nm. The resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any dissolution from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/$cm^2$, more preferably about 10 to 100 mJ/$cm^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate.

The resist pattern as developed is then cured through crosslinking which can be induced by irradiation of light of up to 180 nm wavelength and optionally heat. Irradiated after development is high-energy radiation of up to 180 nm wavelength, for example, $Xe_2$ excimer light of 172 nm wavelength, $F_2$ excimer light of 157 nm wavelength, $Kr_2$ excimer light of 146 nm wavelength, $Ar_2$ excimer light of 126 nm wavelength, or electron beam (EB). The exposure dose is 10 mJ/$cm^2$ to 10 J/$cm^2$ for light and 1 μC/$cm^2$ to 1 C/$cm^2$ for EB. Irradiation of light of up to 180 nm wavelength or EB not only causes the photoacid generator to generate an acid, but also promotes photo-induced crosslinking reaction. When a thermal acid generator in the form of an ammonium salt is added to a photoresist composition, an acid can be generated by heating. In this case, acid generation and crosslinking reaction proceed simultaneously. The preferred heating conditions include a temperature of 100 to 300° C., and especially 130 to 250° C., and a time of 10 to 300 seconds. The timing of heating may be before or after the irradiation. As a result, a crosslinked resist film is formed which is insoluble in solvents and alkaline developers.

If the resist film is irradiated in air with light of up to 180 nm wavelength, the resist surface can be oxidized with the ozone thus generated so that the film thickness is substantially reduced. Since ozone oxidation by light irradiation is generally utilized for cleaning off organic matter deposited on the substrate, the resist film is also cleaned by ozone. This indicates that the resist film can be consumed if the exposure dose is too much. It is thus desirable to perform light irradiation in the atmosphere which has been purged with an inert gas such as nitrogen gas, He gas, Ar gas or Kr gas. Also desirably EB irradiation is performed in vacuum.

Next, a resist material is coated onto the intermediate intervening layer of hard mask or the like having the pattern of crosslinked resist film formed thereon, thereby forming a second resist film. The resist material used at this point is preferably a positive resist composition, and more preferably a chemically amplified positive resist composition. The resist material used at this point may be the same as the resist composition disclosed herein or any of well-known resist compositions. The pattern forming process of the invention is characterized by the acid and/or heat-induced crosslinking reaction of the first resist pattern after development, while the crosslinking reaction of the second resist pattern after development is not necessarily needed. Namely, the 7-oxanorbornane ring as represented by formula (1) is not essential for the resist material for forming the second resist pattern.

Preferably the second resist film is exposed and developed in a conventional way to form a pattern of second resist film in the space area of the above-described pattern of crosslinked resist film, for thereby reducing the distance between patterns to one half. The conditions of exposure and development may be the same as the previous conditions.

Next, using the crosslinked resist film and second resist film as a mask, the intermediate intervening layer of hard mask or the like is etched, and the processable substrate further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, and NMR for nuclear magnetic resonance. For all polymers, Mw and Mn are determined by GPC versus polystyrene standards.

Synthesis Examples

Polymers to be used in resist compositions were prepared by combining various monomers, effecting copolymerization reaction in tetrahydrofuran medium, crystallization in methanol, repeatedly washing with hexane, isolation, and drying. The resulting polymers (Polymers 1 to 16) had the composition shown below. The composition of each polymer was analyzed by $^1$H-NMR, and the Mw and Mw/Mn determined by GPC.

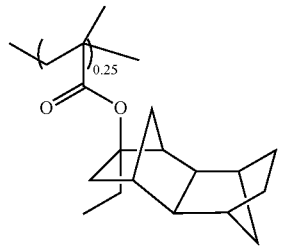

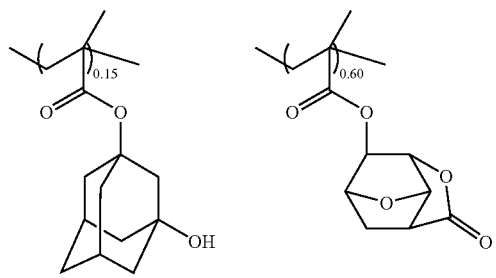

Mw = 9,200
Mw/Mn = 1.82

Polymer 1

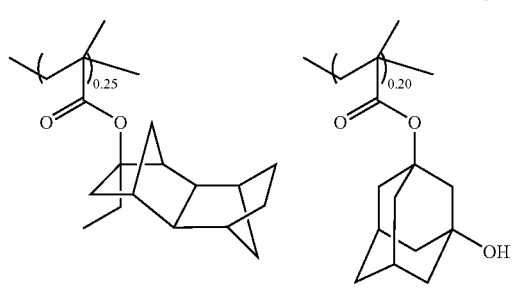

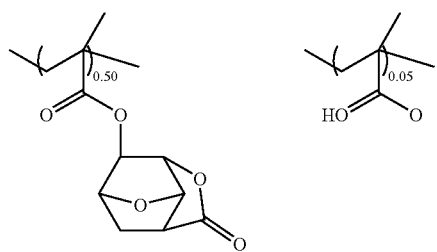

Mw = 8,300
Mw/Mn = 1.73

Polymer 2

-continued
Polymer 3
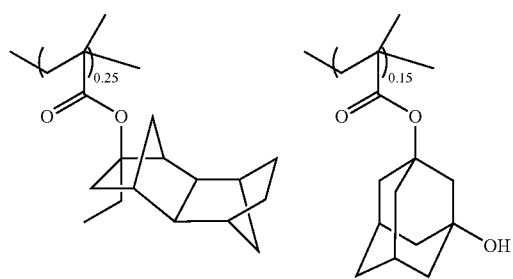
Mw = 7,300
Mw/Mn = 1.67
Polymer 3
Polymer 4
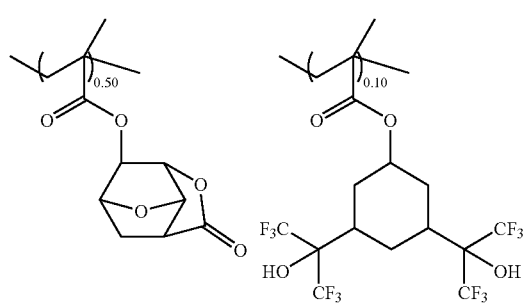
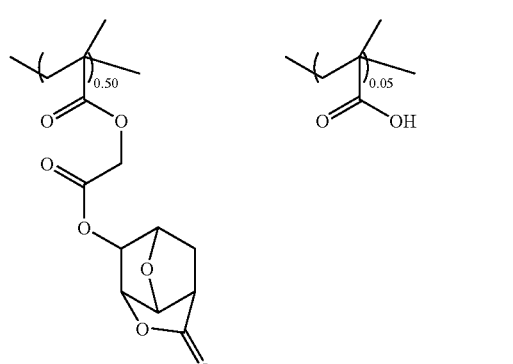
Mw = 9,400
Mw/Mn = 1.72
Polymer 4
Polymer 5
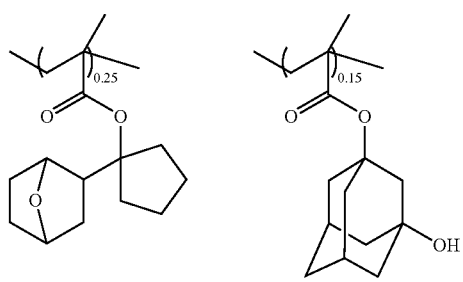
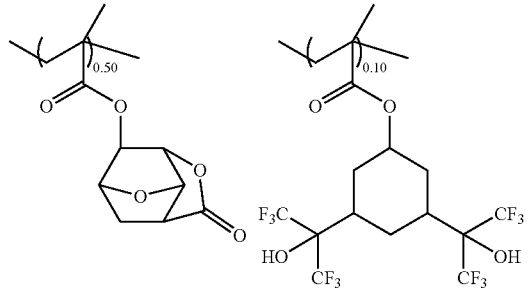
Mw = 7,600
Mw/Mn = 1.75
Polymer 5
Polymer 6
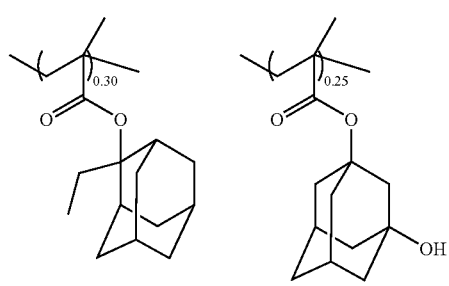
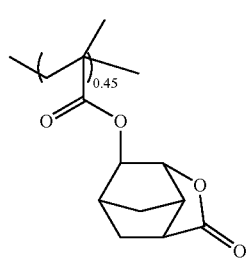
Mw = 7,600
Mw/Mn = 1.79
Polymer 6
Polymer 7
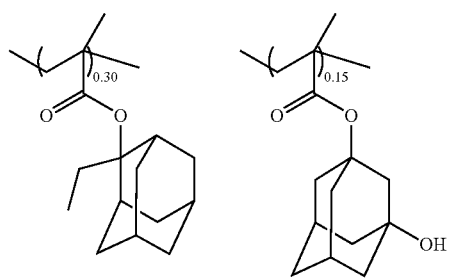

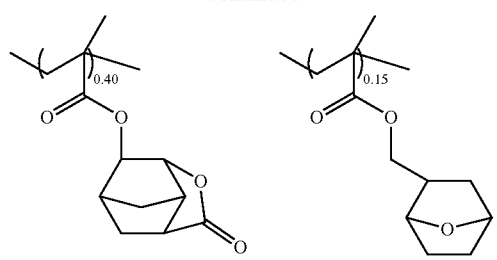
Mw = 7,900
Mw/Mn = 1.61
Polymer 7
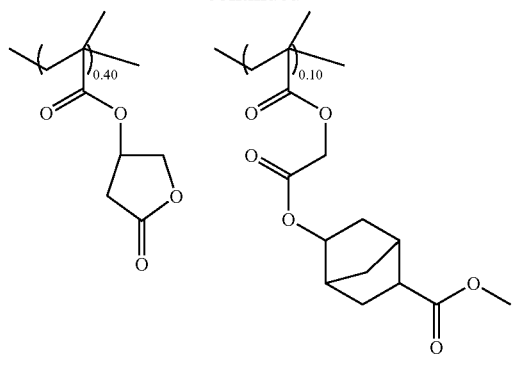
Mw = 6,800
Mw/Mn = 1.62
Polymer 9
Polymer 8
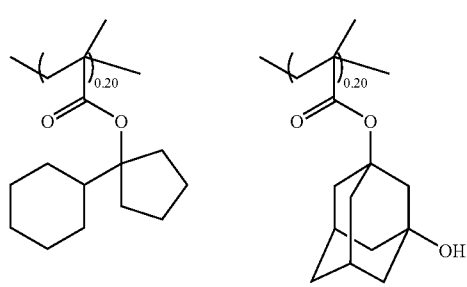
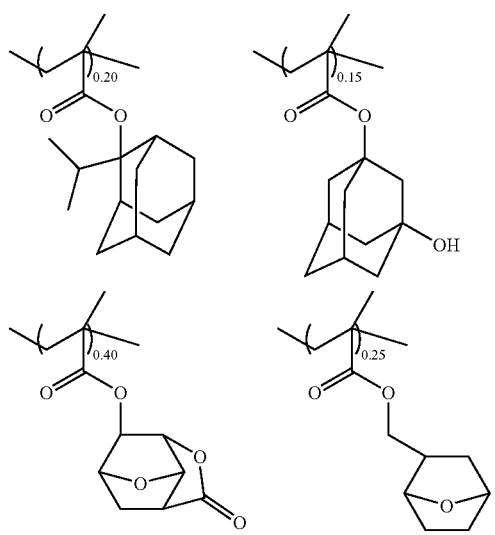
Mw = 7,900
Mw/Mn = 1.61
Polymer 10
Polymer 10
Polymer 11
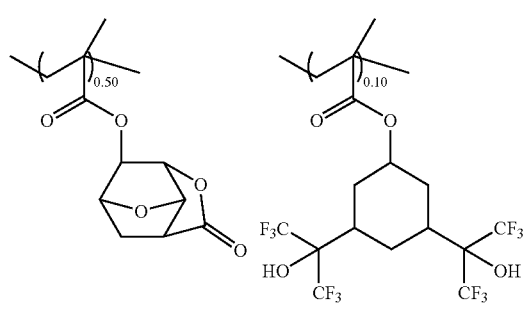
Mw = 6,900
Mw/Mn = 1.74
Polymer 8
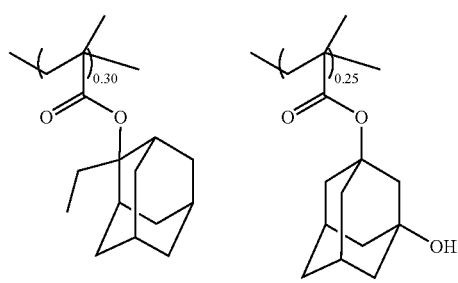
Polymer 9
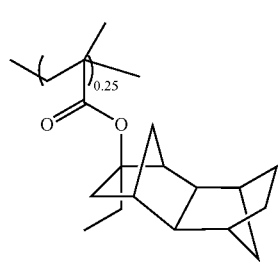
Mw = 9,800
Mw/Mn = 1.82
Polymer 11

Polymer 12

Mw = 9,300
Mw/Mn = 1.98
Polymer 12

Polymer 13

Mw = 9,300
Mw/Mn = 1.79
Polymer 13

Polymer 14

Mw = 8,200
Mw/Mn = 1.79
Polymer 14

Polymer 15

Mw = 8,200
Mw/Mn = 1.93
Polymer 15

Polymer 16

-continued

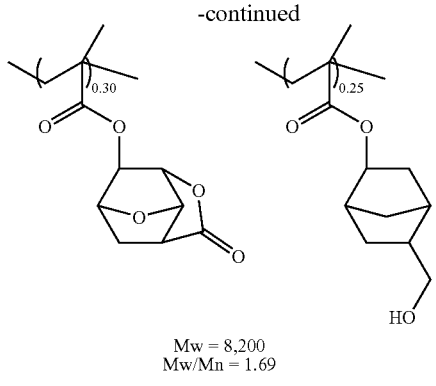

Mw = 8,200
Mw/Mn = 1.69
Polymer 16

Examples 1 to 29 and Comparative Examples 1 to 3

Light-Induced Crosslinking Test on Polymers

The above-synthesized polymers (Polymers 1 to 16) were examined for crosslinking with the aid of light irradiation. A solution was prepared by mixing each polymer, an acid generator and an organic solvent in accordance with the recipe shown in Table 1, and filtering through a Teflon® filter with a pore size of 0.2 μm.

The components in Table 1 are identified below.

Acid Generator: PAG1 of the Following Structural Formula

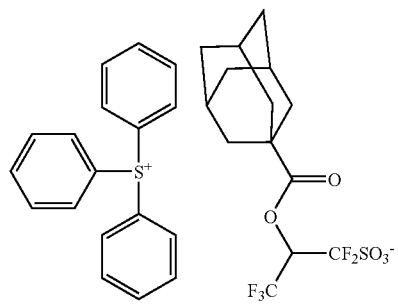

PAG 1

Organic Solvent: propylene glycol monomethyl ether acetate (PGMEA) and cyclohexanone (CyH)

Each polymer solution was coated onto a 8-inch silicon substrate and baked at 180° C. for 60 seconds to form a polymer film having a thickness of 200 nm, as measured by an optical film thickness gauge.

For the films of Examples 1 to 11, light from a $Xe_2$ excimer lamp (Ushio Inc.) having a wavelength of 172 nm and an output of 10 mW was irradiated in a dose of 1 $J/cm^2$. For the films of Examples 13 to 28, light from the $Xe_2$ excimer lamp was irradiated in a dose of 100 $mJ/cm^2$, followed by baking at 200° C. for 60 seconds. For the film of Example 12, light from a $Kr_2$ excimer lamp (Ushio Inc.) having a wavelength of 146 nm and an output of 2 mW was irradiated in a dose of 1 $J/cm^2$. For the film of Example 29, baking at 200° C. for 60 seconds was followed by light irradiation from the $Xe_2$ excimer lamp in a dose of 100 mJ/cm.

Comparative Example 1 omitted light irradiation. For the film of Comparative Example 2, light from an ArF excimer laser of 193 nm wavelength was irradiated in a dose of 100 $mJ/cm^2$. For the film of Comparative Example 3, light from the ArF excimer laser of 193 nm wavelength was irradiated in a dose of 100 $mJ/cm^2$, followed by baking at 200° C. for 60 seconds.

In a slimming test by solvent application, a solvent mixture of PGMEA and CyH in a weight ratio of 70/30 was dispensed for 20 seconds on the polymer film, which was spin dried at 2,000 rpm for 30 seconds and dried at 100° C. for 60 seconds. The film thickness was measured again, from which a difference in film thickness before and after solvent application was computed. In a slimming test by development, the polymer film was puddle developed with an aqueous solution of 2.38 wt % tetramethylammonium hydroxide (TMAH) for 30 seconds, and a difference in film thickness before and after development was computed. The results are shown in Table 1.

TABLE 1

| | | Polymer (pbw) | PAG (pbw) | Organic solvent (pbw) | Film thickness reduction after solvent application (nm) | Film thickness reduction after development (nm) |
|---|---|---|---|---|---|---|
| Example | 1 | Polymer 1 (100) | — | PGMEA (800) CyH (200) | 0.5 | 0 |
| | 2 | Polymer 2 (100) | — | PGMEA (800) CyH (200) | 0.8 | 0 |
| | 3 | Polymer 3 (100) | — | PGMEA (800) CyH (200) | 1.2 | 0 |
| | 4 | Polymer 4 (100) | — | PGMEA (800) CyH (200) | 1.0 | 0 |
| | 5 | Polymer 5 (100) | — | PGMEA (800) CyH (200) | 1.5 | 0.6 |
| | 6 | Polymer 6 (100) | — | PGMEA (800) CyH (200) | 4.0 | 2.5 |
| | 7 | Polymer 7 (100) | — | PGMEA (800) CyH (200) | 0.5 | 0 |
| | 8 | Polymer 8 (100) | — | PGMEA (800) CyH (200) | 1.5 | 0 |

TABLE 1-continued

|  |  | Polymer (pbw) | PAG (pbw) | Organic solvent (pbw) | Film thickness reduction after solvent application (nm) | Film thickness reduction after development (nm) |
|---|---|---|---|---|---|---|
|  | 9 | Polymer 9 (100) | — | PGMEA (800) CyH (200) | 4.2 | 3.8 |
|  | 10 | Polymer 10 (100) | — | PGMEA (800) CyH (200) | 1.2 | 0 |
|  | 11 | Polymer 11 (100) | — | PGMEA (800) CyH (200) | 5.5 | 3.3 |
|  | 12 | Polymer 1 (100) | — | PGMEA (800) CyH (200) | 0.1 | 0 |
|  | 13 | Polymer 1 (100) | PAG1 (4.0) | PGMEA (800) CyH (200) | 0 | 0.5 |
|  | 14 | Polymer 2 (100) | PAG1 (4.0) | PGMEA (800) CyH (200) | 0 | 0.8 |
|  | 15 | Polymer 3 (100) | PAG1 (4.0) | PGMEA (800) CyH (200) | 0 | 1.2 |
|  | 16 | Polymer 4 (100) | PAG1 (4.0) | PGMEA (800) CyH (200) | 0 | 0.9 |
|  | 17 | Polymer 5 (100) | PAG1 (4.0) | PGMEA (800) CyH (200) | 0 | 2.2 |
|  | 18 | Polymer 6 (100) | PAG1 (4.0) | PGMEA (800) CyH (200) | 3.3 | 3.2 |
|  | 19 | Polymer 7 (100) | PAG1 (4.0) | PGMEA (800) CyH (200) | 0 | 1.4 |
|  | 20 | Polymer 8 (100) | PAG1 (4.0) | PGMEA (800) CyH (200) | 0 | 1.2 |
|  | 21 | Polymer 9 (100) | PAG1 (4.0) | PGMEA (800) CyH (200) | 3.8 | 3.6 |
|  | 22 | Polymer 10 (100) | PAG1 (4.0) | PGMEA (800) CyH (200) | 0 | 0.8 |
|  | 23 | Polymer 11 (100) | PAG1 (4.0) | PGMEA (800) CyH (200) | 3.9 | 3.6 |
|  | 24 | Polymer 12 (100) | PAG1 (4.0) | PGMEA (800) CyH (200) | 0 | 0 |
|  | 25 | Polymer 13 (100) | PAG1 (4.0) | PGMEA (800) CyH (200) | 0 | 0 |
|  | 26 | Polymer 14 (100) | PAG1 (4.0) | PGMEA (800) CyH (200) | 0 | 0 |
|  | 27 | Polymer 15 (100) | PAG1 (4.0) | PGMEA (800) CyH (200) | 0 | 0 |
|  | 28 | Polymer 16 (100) | PAG1 (4.0) | PGMEA (800) CyH (200) | 0 | 0 |
|  | 29 | Polymer 1 (100) | PAG1 (4.0) | PGMEA (800) CyH (200) | 0 | 1.8 |
| Comparative Example | 1 | Polymer 1 (100) | PAG1 (4.0) | PGMEA (800) CyH (200) | 200 | 0 |
|  | 2 | Polymer 1 (100) | PAG1 (4.0) | PGMEA (800) CyH (200) | 200 | 0 |
|  | 3 | Polymer 6 (100) | PAG1 (4.0) | PGMEA (800) CyH (200) | 0 | 50 |

It is seen from the data in Table 1 that polymer films are improved in solvent resistance and alkaline developer resistance by irradiation of light of up to 180 nm wavelength, demonstrating a progress of crosslinking by light irradiation.

Examples 30 to 48 and Comparative Examples 4, 5

Preparation of Positive Resist Composition

A resist solution was prepared by dissolving each of the above-synthesized polymers (Polymers 1 to 16) and other components in a solvent in accordance with the recipe shown in Table 2, and filtering through a Teflon® filter with a pore size of 0.2 μm.

The components in Table 2 are identified below.

Acid Generator: PAG1 and PAG2 of the Following Structural Formulae

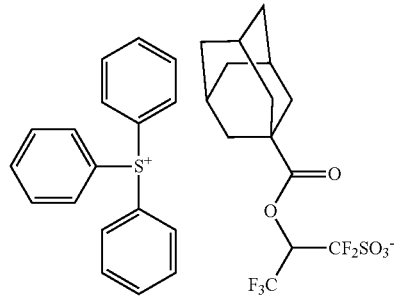

PAG 1

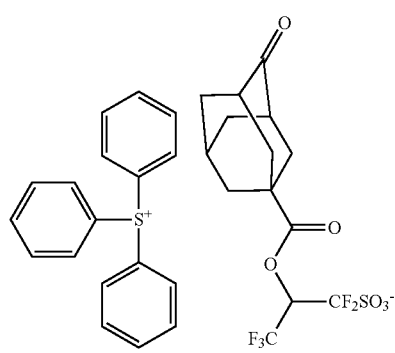

PAG 2

Basic Compound: Quencher 1 of the Following Structural Formula

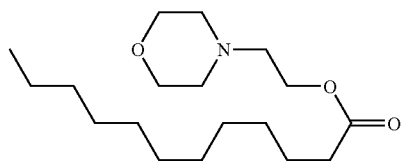

Quencher 1

Organic Solvent: PGMEA and CyH

Double Patterning Test

On a substrate (silicon wafer) having an antireflective coating (ARC-29A, Nissan Chemical Industries, Ltd.) of 80 nm thick, each of the resist compositions of Examples 30 to 48 and Comparative Examples 4 and 5 shown in Table 2 was spin coated, then baked on a hot plate at 110° C. for 60 seconds to form a resist film having a thickness of 120 nm.

The resist film was exposed by means of an ArF excimer laser scanner model NSR-S307E (Nikon Corp., NA 0.85, σ 0.93, normal illumination, 6% halftone phase shift mask). Immediately after exposure, the resist film was baked (PEB) at 100° C. for 60 seconds and then developed for 30 seconds with a 2.38 wt % aqueous solution of tetramethylammonium hydroxide (TMAH), obtaining an isolated positive pattern (1st pattern) having a size of 70 nm and a pitch of 350 nm.

For the resist compositions of Examples 30 to 41, the coated wafer was exposed over its entire surface by a $Xe_2$ excimer lamp of 172 nm wavelength in an exposure dose of 3 $J/cm^2$. For the resist composition of Comparative Example 5, the coated wafer was baked at 180° C. for 60 seconds and then exposed over its entire surface by a ArF excimer laser of 193 nm wavelength in an exposure dose of 100 $mJ/cm^2$. For the resist compositions of Examples 42 to 47, the coated wafer was exposed by a $Xe_2$ excimer lamp of 172 nm wavelength in an exposure dose of 100 mJ/cm2 and then baked at 200° C. for 60 seconds. For the resist composition of Example 48, the coated wafer was baked at 200° C. for 60 seconds and then exposed by a $Xe_2$ excimer lamp of 172 nm wavelength in an exposure dose of 100 $mJ/cm^2$.

Next, the same resist composition was coated on the 1st pattern-bearing wafer so as to form a resist film of 120 nm thick, and baked. The coated wafer was exposed by means of an ArF excimer laser scanner in the same manner as the 1st pattern formation, but using a mask having a line pattern which was shifted 170 nm relative to the first line pattern on the wafer, followed by PEB and development. The size of the 1st pattern was measured, with the results shown in Table 2.

TABLE 2

|  |  | Polymer (pbw) | PAG (pbw) | Basic compound (pbw) | Organic solvent (pbw) | Wavelength and dose of light irradiated | Size of 1st pattern after 2nd pattern formation |
| --- | --- | --- | --- | --- | --- | --- | --- |
| Example | 30 | Polymer 1 (100) | PAG1 (14.0) | Quencher 1 (1.60) | PGMEA (1,500) CyH (500) | 172 nm, 1 $J/cm^2$ | 61 nm |
|  | 31 | Polymer 2 (100) | PAG1 (14.0) | Quencher 1 (1.60) | PGMEA (1,500) CyH (500) | 172 nm, 1 $J/cm^2$ | 63 nm |
|  | 32 | Polymer 3 (100) | PAG1 (14.0) | Quencher 1 (1.60) | PGMEA (1,500) CyH (500) | 172 nm, 1 $J/cm^2$ | 60 nm |
|  | 33 | Polymer 4 (100) | PAG1 (14.0) | Quencher 1 (1.60) | PGMEA (1,500) CyH (500) | 172 nm, 1 $J/cm^2$ | 72 nm |
|  | 34 | Polymer 5 (100) | PAG1 (14.0) | Quencher 1 (1.60) | PGMEA (1,500) CyH (500) | 172 nm, 1 $J/cm^2$ | 65 nm |
|  | 35 | Polymer 6 (100) | PAG1 (14.0) | Quencher 1 (1.60) | PGMEA (1,500) CyH (500) | 172 nm, 1 $J/cm^2$ | 42 nm |
|  | 36 | Polymer 7 (100) | PAG1 (14.0) | Quencher 1 (1.60) | PGMEA (1,500) CyH (500) | 172 nm, 1 $J/cm^2$ | 57 nm |

TABLE 2-continued

|  |  | Polymer (pbw) | PAG (pbw) | Basic compound (pbw) | Organic solvent (pbw) | Wavelength and dose of light irradiated | Size of 1st pattern after 2nd pattern formation |
|---|---|---|---|---|---|---|---|
|  | 37 | Polymer 8 (100) | PAG1 (14.0) | Quencher 1 (1.60) | PGMEA (1,500) CyH (500) | 172 nm, 1 J/cm² | 58 nm |
|  | 38 | Polymer 9 (100) | PAG1 (14.0) | Quencher 1 (1.60) | PGMEA (1,500) CyH (500) | 172 nm, 1 J/cm² | 48 nm |
|  | 39 | Polymer 10 (100) | PAG1 (14.0) | Quencher 1 (1.60) | PGMEA (1,500) CyH (500) | 172 nm, 1 J/cm² | 56 nm |
|  | 40 | Polymer 11 (100) | PAG1 (14.0) | Quencher 1 (1.60) | PGMEA (1,500) CyH (500) | 172 nm, 1 J/cm² | 46 nm |
|  | 41 | Polymer 2 (100) | PAG2 (14.0) | Quencher 1 (1.60) | PGMEA (1,500) CyH (500) | 172 nm, 1 J/cm² | 64 nm |
|  | 42 | Polymer 2 (100) | PAG1 (14.0) | Quencher 1 (1.60) | PGMEA (1,500) CyH (500) | 172 nm, 100 mJ/cm² | 52 nm |
|  | 43 | Polymer 12 (100) | PAG1 (14.0) | Quencher 1 (1.60) | PGMEA (1,500) CyH (500) | 172 nm, 100 mJ/cm² | 62 nm |
|  | 44 | Polymer 13 (100) | PAG1 (14.0) | Quencher 1 (1.60) | PGMEA (1,500) CyH (500) | 172 nm, 100 mJ/cm² | 68 nm |
|  | 45 | Polymer 14 (100) | PAG1 (14.0) | Quencher 1 (1.60) | PGMEA (1,500) CyH (500) | 172 nm, 100 mJ/cm | 66 nm |
|  | 46 | Polymer 15 (100) | PAG1 (14.0) | Quencher 1 (1.60) | PGMEA (1,500) CyH (500) | 172 nm, 100 mJ/cm² | 68 nm |
|  | 47 | Polymer 16 (100) | PAG1 (14.0) | Quencher 1 (1.60) | PGMEA (1,500) CyH (500) | 172 nm, 100 mJ/cm² | 70 nm |
|  | 48 | Polymer 16 (100) | PAG1 (14.0) | Quencher 1 (1.60) | PGMEA (1,500) CyH (500) | 172 nm, 100 mJ/cm² | 73 nm |
| Comparative Example | 4 | Polymer 2 (100) | PAG1 (14.0) | Quencher 1 (1.60) | PGMEA (1,500) CyH (500) | — | Pattern vanished |
|  | 5 | Polymer 6 (100) | PAG1 (14.0) | Quencher 1 (1.60) | PGMEA (1,500) CyH (500) | 193 nm, 100 mJ/cm² | 15 nm |

For the resist compositions of Examples 30 to 48, the formation of a 2nd pattern having lines located between lines of the 1st pattern was observed. For the resist composition of Comparative Example 4 which omitted light irradiation, a 2nd pattern was formed, but the 1st pattern did not exist because it had been dissolved upon coating of the second resist material. Where the ArF excimer laser of 193 nm wavelength was used as the light irradiation after 1st pattern formation, as seen from Comparative Example 5, the size of the 1st pattern was considerably reduced because the 1st pattern was incompletely insolubilized.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2007-215860 and 2007-292731 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern comprising the steps of:
applying a first positive resist composition comprising a polymer as a base resin comprising recurring units having acid labile groups and recurring units having adhesive groups of hydroxy and/or lactone ring, an acid generator, and an organic solvent onto a substrate to form a first resist coating, heat treating the first resist coating, exposing to ArF excimer laser radiation, heat treating the exposed coating, developing the coating with a developer to form a first resist pattern, causing the first resist pattern to crosslink and cure by irradiation of high-energy radiation selected from the group consisting of $Xe_2$ excimer light of 172 nm wavelength, $F_2$ excimer light of 157 nm wavelength, $Kr_2$ excimer light of 146 nm wavelength, and $Ar_e$ excimer light of 126 nm wavelength and heating at 100 to 300° C. for 10 to 300 seconds, applying a second positive resist composition comprising a polymer onto the first resist pattern-bearing substrate to form a second resist coating, heat treating the second resist coating, exposing to high-energy radiation, heat treating the exposed coating, developing the second coating with a developer to form a second resist pattern;

wherein the first positive resist composition comprises a polymer, an organic solvent, and an acid generator, said polymer comprising one or both of recurring units (a-1) and (a-2) of the general formula (1), and recurring units of the general formula (b):

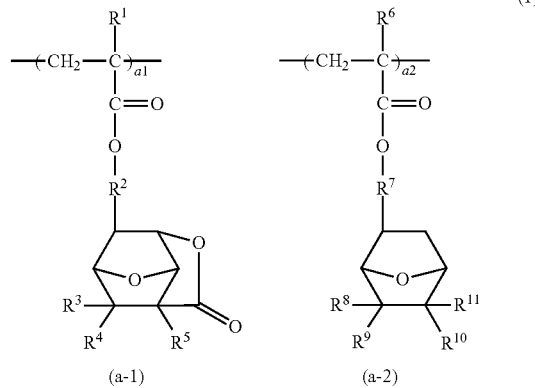

-continued

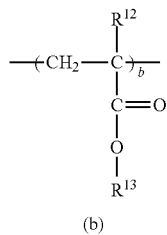

(b)

wherein $R^1$ and $R^6$ are each independently hydrogen, methyl or hydroxymethyl, $R^2$ and $R^7$ are each independently a single bond or a straight, branched or cyclic alkylene group of 1 to 6 carbon atoms which may have an ether or ester group, and which has a primary or secondary carbon atom through which it is attached to the ester (COO) group, $R^3$, $R^4$, $R^5$, $R^8$, $R^9$, $R^{10}$, and $R^{11}$ are each independently hydrogen or a straight, branched or cyclic alkyl group of 1 to 6 carbon atoms, $R^{12}$ is hydrogen, methyl or hydroxymethyl, $R^{13}$ is an acid labile group, a1, a2, and b are numbers in the range: $0 \le a1 < 1.0$, $0 \le a2 < 1.0$, $0 < a1+a2 < 1.0$, $0 < b \le 0.8$, and $0.1 \le a1+a2+b \le 1.0$.

2. The process of claim 1 wherein the exposure steps to form the first and second resist patterns are by immersion lithography using an ArF excimer laser of 193 nm wavelength and a liquid having a refractive index of at least 1.4 interposed between a lens and the substrate.

3. The process of claim 2 wherein the liquid is water.

4. The process of claim 1 wherein the first resist pattern includes spaces, the second resist pattern is formed in the spaces of the first resist pattern, whereby the distance between the first and second patterns is reduced.

5. The process of claim 1 wherein the first resist pattern crosses the second resist pattern.

6. The process of claim 1 wherein the second resist pattern is formed in a space area where the first resist pattern is not formed.

7. The process of claim 1 wherein a processable substrate selected from the group consisting of SiO₂, SiN, SiON, SiOC, p-Si, a-Si, TiN, WSi, BPSG, SOG, Cr, CrO, CrON, MoSi, low dielectric film, and etch stopper film is formed on the silicon substrate.

8. The process of claim 1 wherein said polymer in the first positive resist composition further comprises recurring units (c) derived from monomers having adhesive groups selected from the group consisting of hydroxy, cyano, carbonyl, ester, ether groups, lactone rings, carbonyl groups and carboxylic anhydride groups.

9. The process of claim 8 wherein the recurring units (c) are derived from the following monomers:

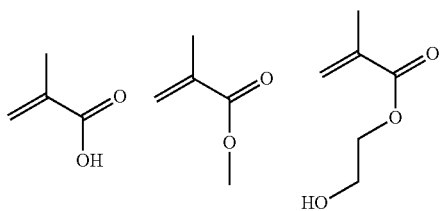

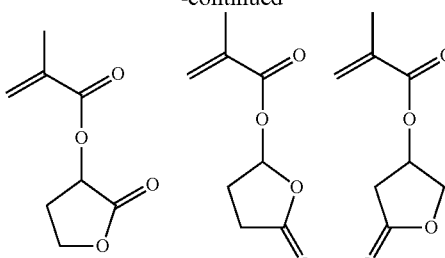

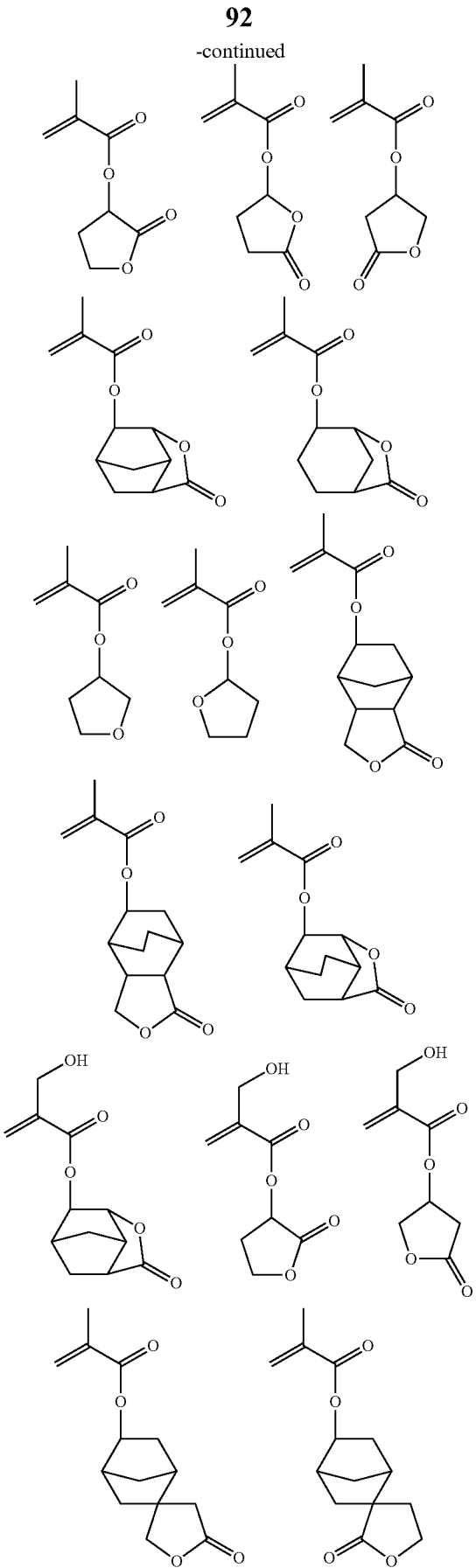

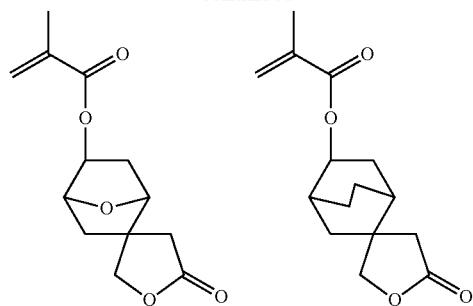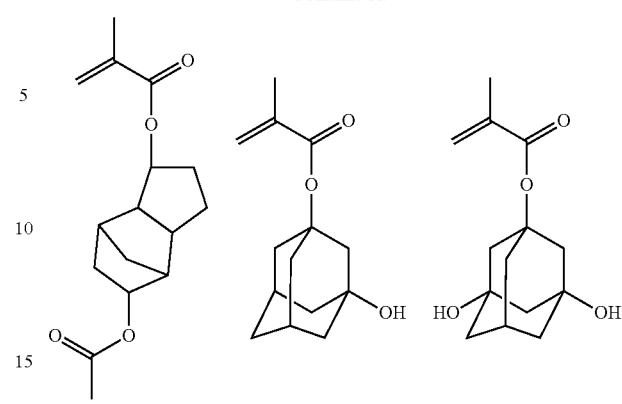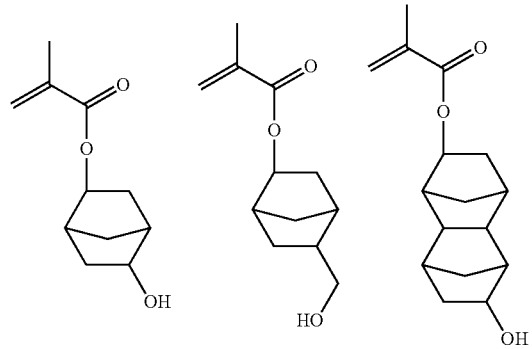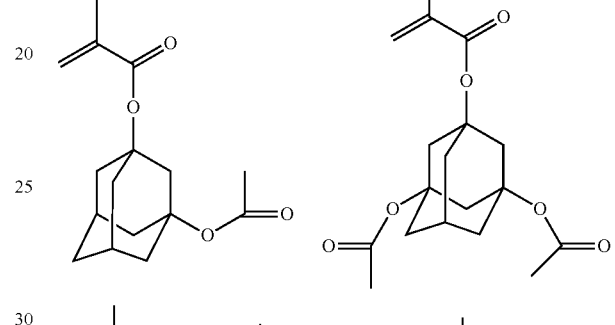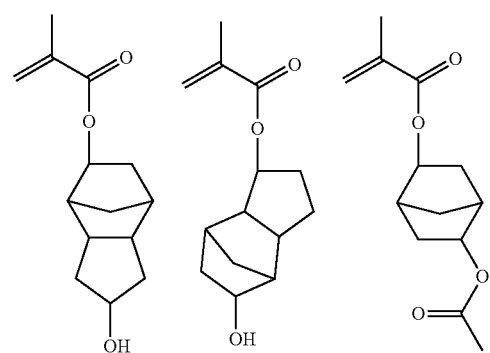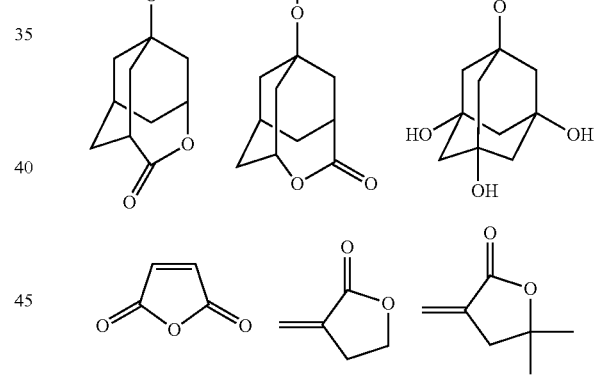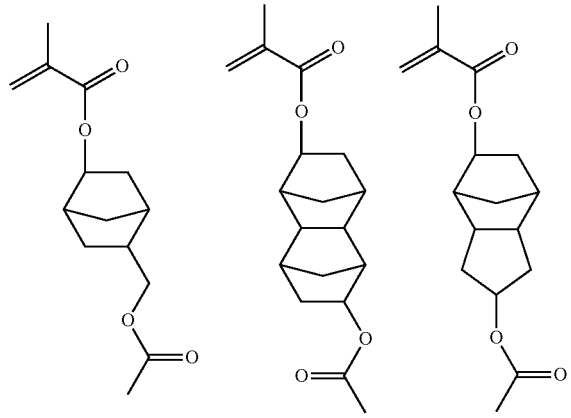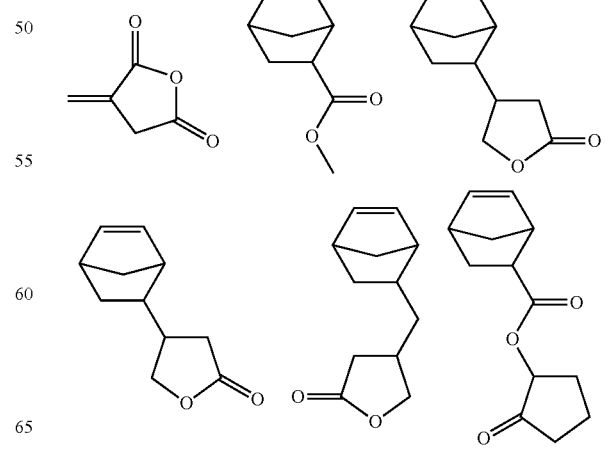

95
-continued
96
-continued
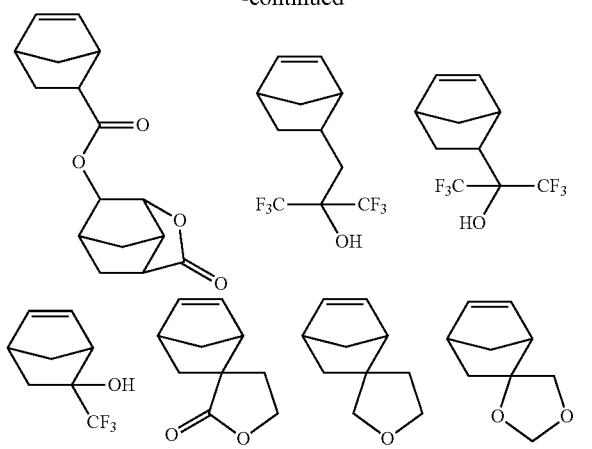
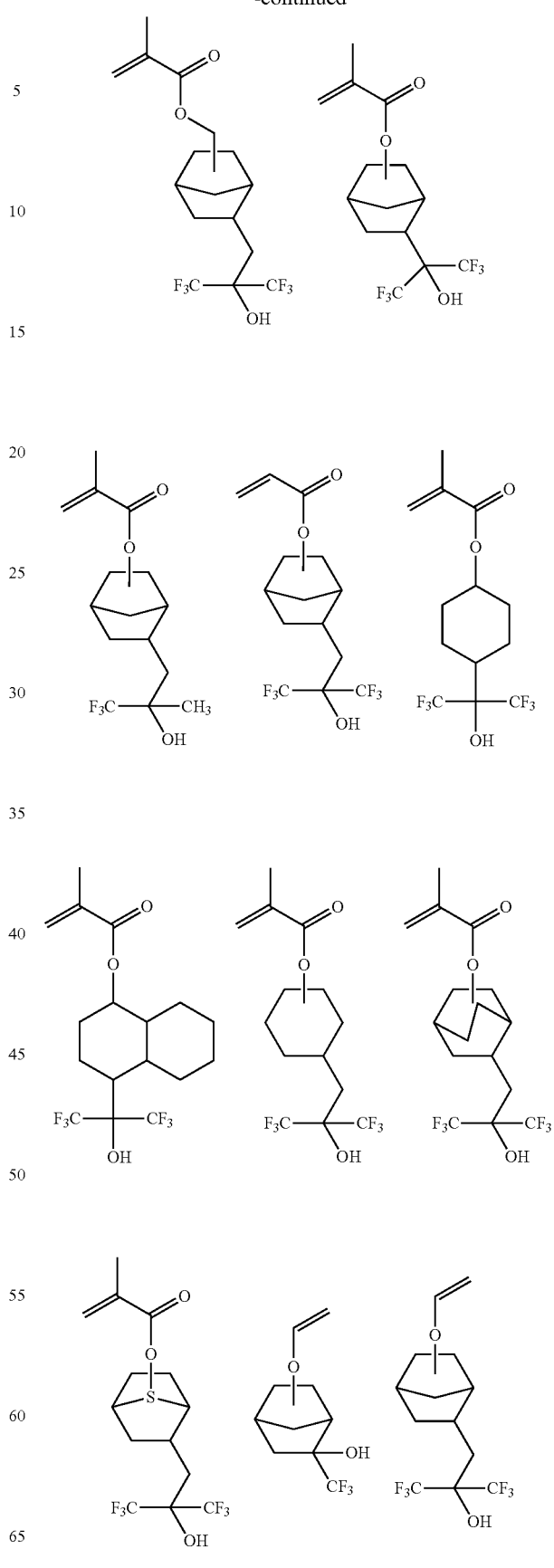

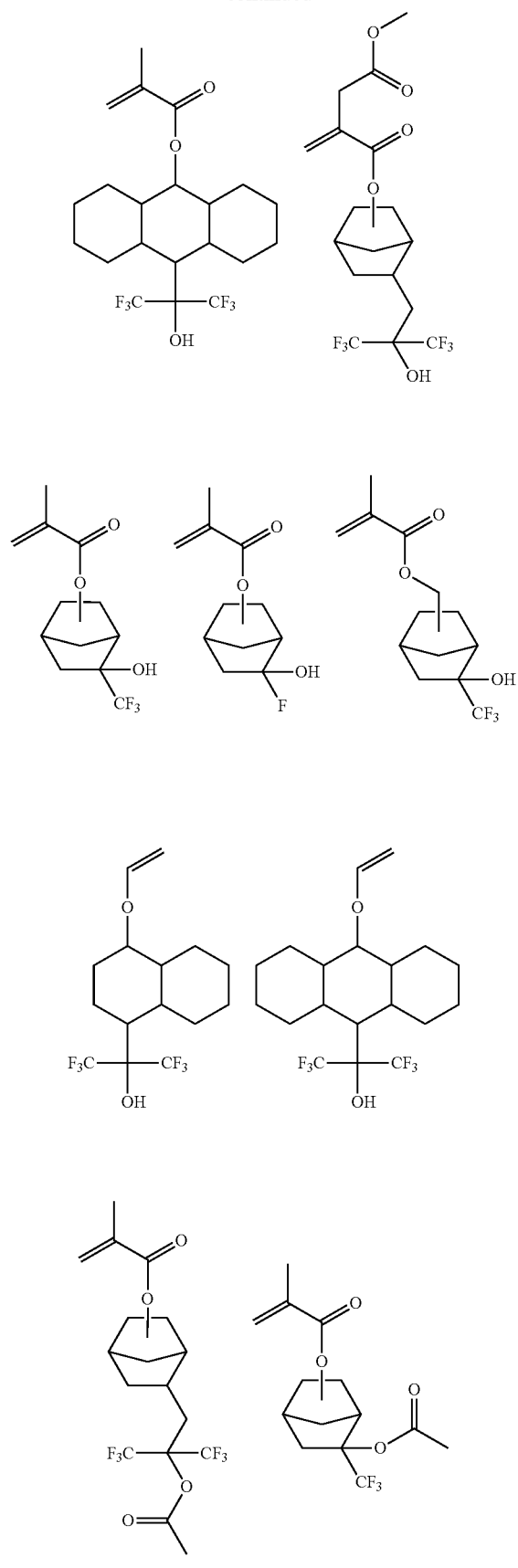
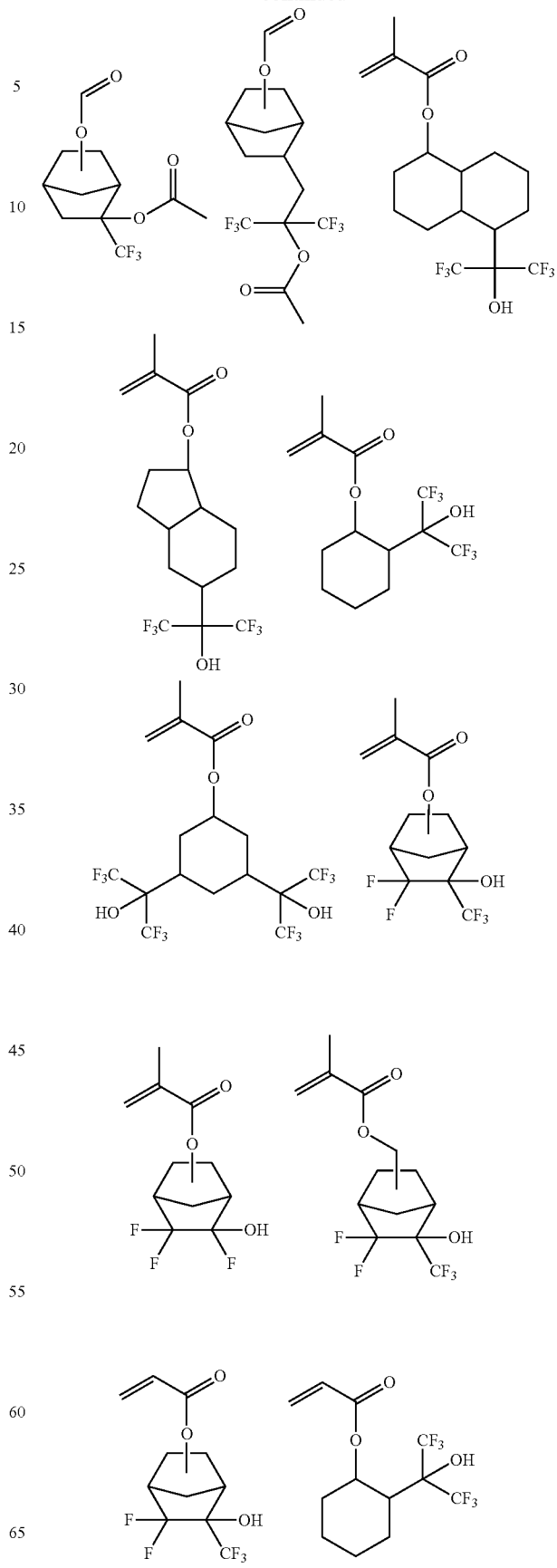

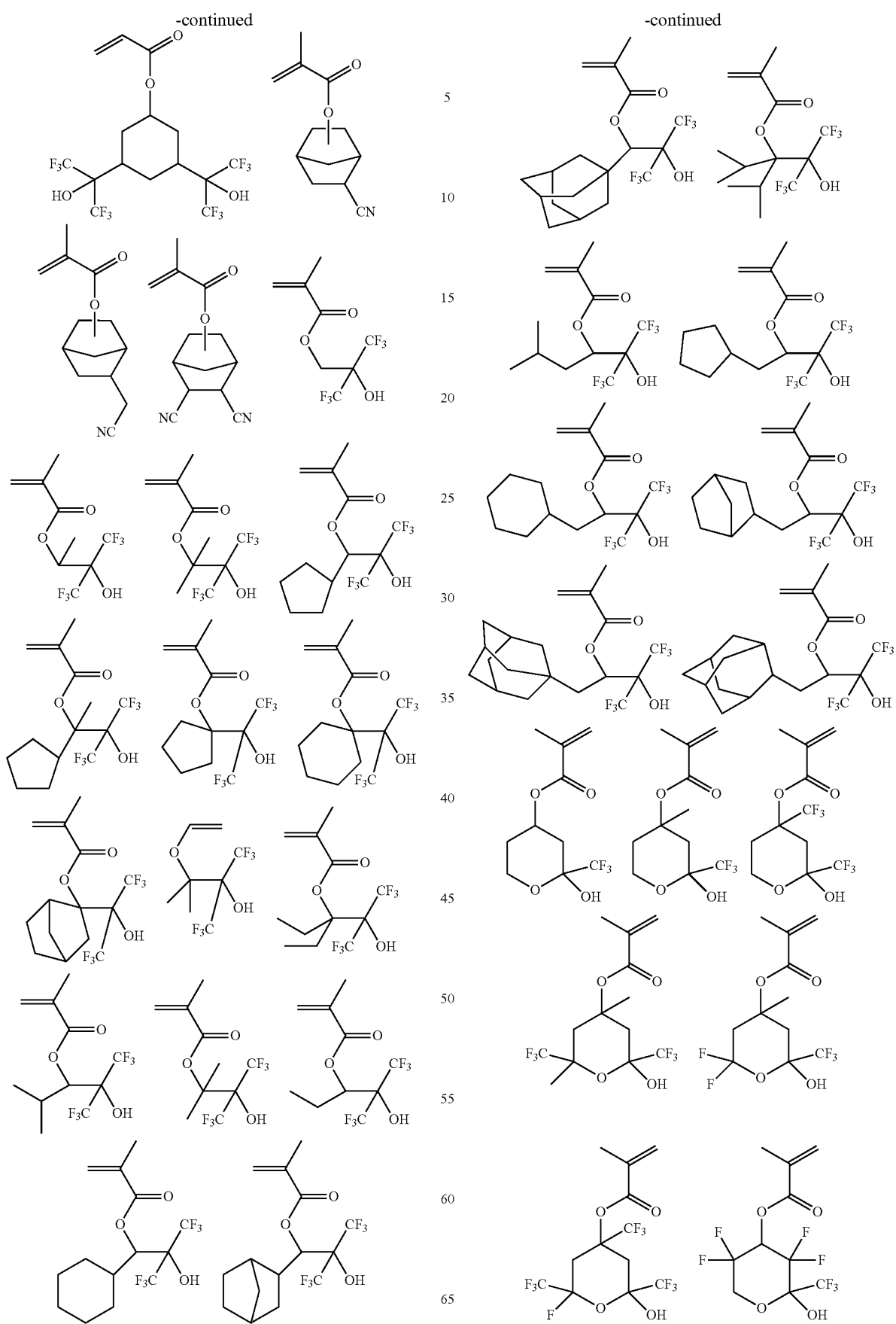

101
-continued
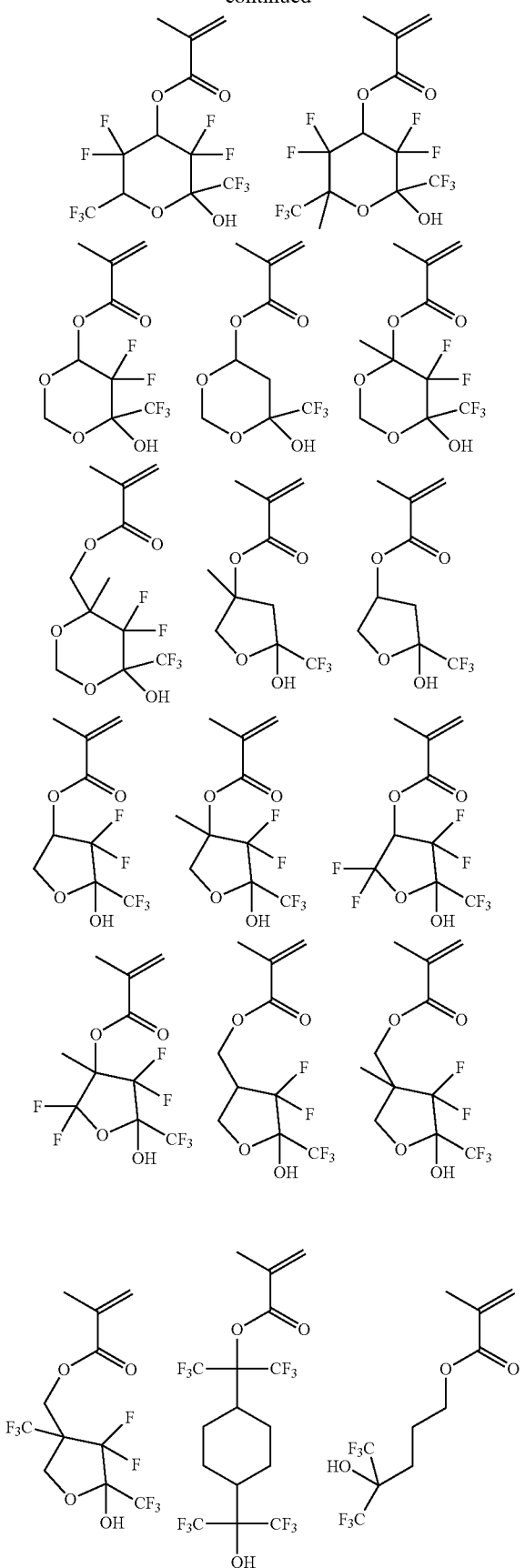
102
-continued
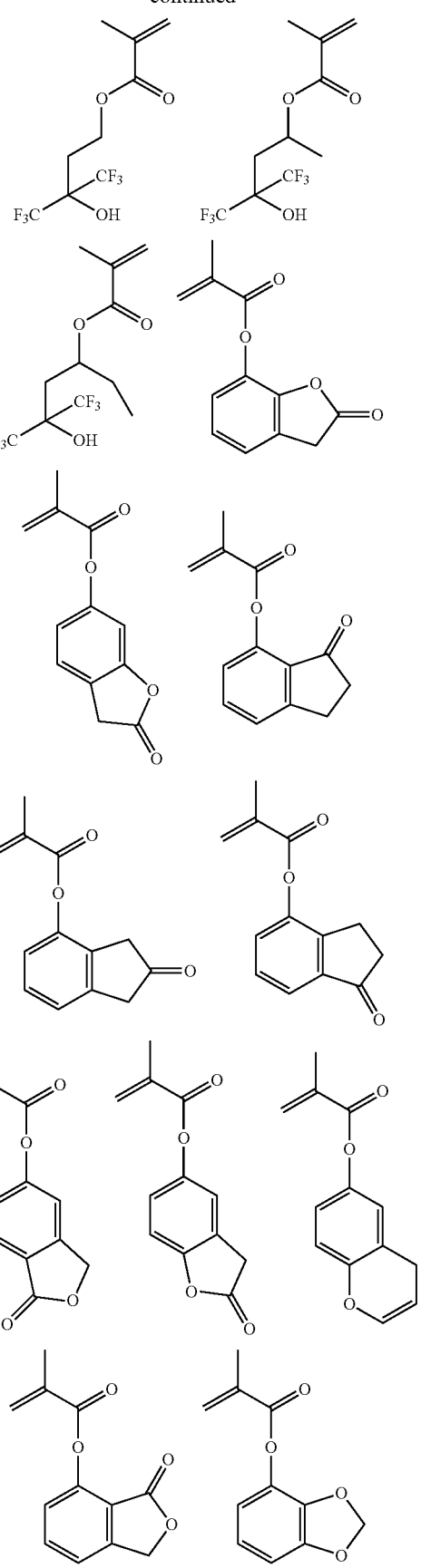

103
-continued
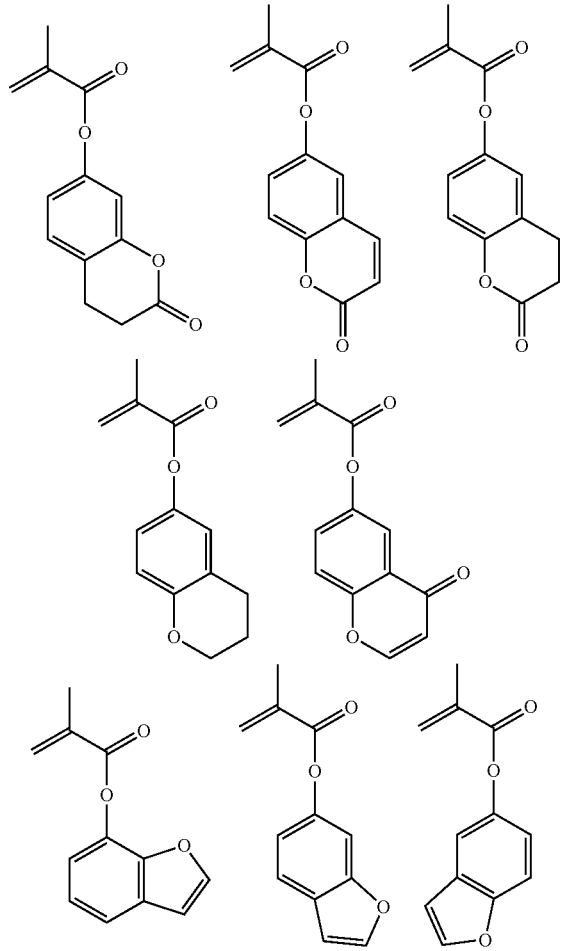
104
-continued
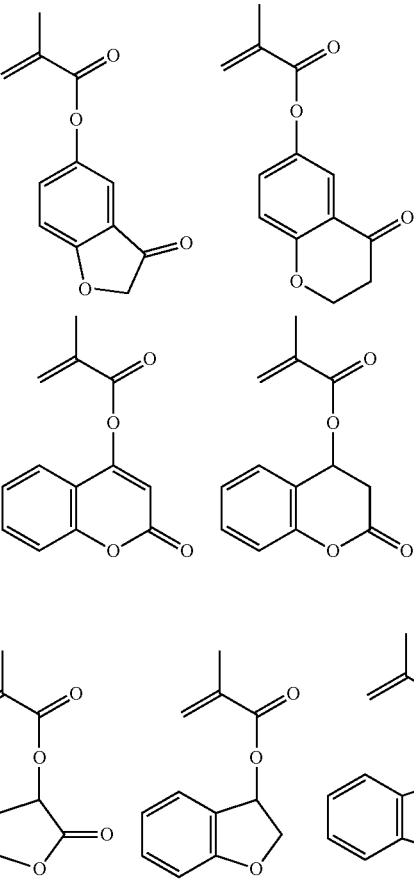
* * * * *